US007662668B2

(12) United States Patent
Sugiura et al.

(10) Patent No.: US 7,662,668 B2
(45) Date of Patent: Feb. 16, 2010

(54) METHOD FOR SEPARATING A SEMICONDUCTOR SUBSTRATE INTO A PLURALITY OF CHIPS ALONG WITH A CUTTING LINE ON THE SEMICONDUCTOR SUBSTRATE

(75) Inventors: Kazuhiko Sugiura, Nagoya (JP); Kenichi Yokoyama, Nagoya (JP); Muneo Tamura, Nagoya (JP); Tetsuo Fujii, Toyohashi (JP); Makoto Asai, Kariya (JP)

(73) Assignee: DENSO CORPORATION, Kariya (JP)

( * ) Notice: Subject to any disclaimer, the term of this patent is extended or adjusted under 35 U.S.C. 154(b) by 375 days.

(21) Appl. No.: 11/591,496

(22) Filed: Nov. 2, 2006

(65) Prior Publication Data

US 2007/0111476 A1 May 17, 2007

(30) Foreign Application Priority Data

| | | | |
|---|---|---|---|
| Nov. 16, 2005 | (JP) | .............................. | 2005-331214 |
| Nov. 16, 2005 | (JP) | .............................. | 2005-331215 |
| Nov. 16, 2005 | (JP) | .............................. | 2005-331216 |

(51) Int. Cl.
*H01L 21/00* (2006.01)

(52) U.S. Cl. ................ 438/113; 438/114; 257/E21.599

(58) Field of Classification Search .................. 438/33, 438/68, 113, 114, 458, 460; 156/344, 379.8, 156/464, 581; 257/E21.599
See application file for complete search history.

(56) References Cited

U.S. PATENT DOCUMENTS

| | | | | |
|---|---|---|---|---|
| 6,297,131 | B1 * | 10/2001 | Yamada et al. | .............. 438/464 |
| 6,750,074 | B2 | 6/2004 | Teshirogi et al. | |
| 6,902,944 | B2 | 6/2005 | Teshirogi et al. | |
| 6,992,026 | B2 | 1/2006 | Fukuyo et al. | |
| 2002/0192867 | A1 * | 12/2002 | Nishiyama | .................. 438/110 |
| 2004/0002199 | A1 | 1/2004 | Fukuyo et al. | |
| 2004/0102025 | A1 * | 5/2004 | Arita | .......................... 438/460 |
| 2005/0059183 | A1 | 3/2005 | Nagai et al. | |
| 2005/0173387 | A1 | 8/2005 | Fukuyo et al. | |
| 2005/0181581 | A1 | 8/2005 | Fukuyo et al. | |
| 2005/0184037 | A1 | 8/2005 | Fukuyo et al. | |
| 2005/0189330 | A1 | 9/2005 | Fukuyo et al. | |
| 2005/0194364 | A1 | 9/2005 | Fukuyo et al. | |

(Continued)

FOREIGN PATENT DOCUMENTS

| | | |
|---|---|---|
| JP | A-53-108276 | 9/1978 |

(Continued)

OTHER PUBLICATIONS

Japan Publication (2003-088976) Fukuyo Fumitsugu "Laser Beam Machining Method", (Mar. 25, 2003), Machine English Translation.*

(Continued)

*Primary Examiner*—Khiem D Nguyen
(74) *Attorney, Agent, or Firm*—Posz Law Group, PLC

(57) ABSTRACT

A separating device for separating a semiconductor substrate includes: a cutting element for cutting the semiconductor substrate into a plurality of chips along with a cutting line on the semiconductor substrate; an adsorbing element for adsorbing a dust on a surface of the semiconductor substrate by using electrostatic force; and a static electricity generating element for generating static electricity and for controlling the static electricity in order to remove the dust from the adsorbing element.

1 Claim, 23 Drawing Sheets

U.S. PATENT DOCUMENTS

| | | | |
|---|---|---|---|
| 2005/0199592 | A1 | 9/2005 | Iri et al. |
| 2005/0202596 | A1 | 9/2005 | Fukuyo et al. |
| 2005/0221587 | A1 | 10/2005 | Teshirogi et al. |
| 2005/0221588 | A1 | 10/2005 | Teshirogi et al. |
| 2005/0221589 | A1 | 10/2005 | Teshirogi et al. |
| 2006/0011593 | A1 | 1/2006 | Fukuyo et al. |
| 2006/0040473 | A1 | 2/2006 | Fukuyo et al. |
| 2006/0160331 | A1 | 7/2006 | Fukuyo et al. |

FOREIGN PATENT DOCUMENTS

| | | | |
|---|---|---|---|
| JP | U-1-78021 | | 5/1989 |
| JP | U-04-68542 | | 6/1992 |
| JP | A-04-255243 | | 9/1992 |
| JP | A-6-251892 | | 9/1994 |
| JP | A-8-316178 | | 11/1996 |
| JP | 2003-088976 | * | 3/2003 |
| JP | A-2004-335909 | | 11/2004 |
| JP | A-2005-223285 | | 8/2005 |
| JP | A-2005-243977 | | 9/2005 |

OTHER PUBLICATIONS

Office Action dated Mar. 13, 2008 in corresponding German Patent Application No. 10 2006 054 087.5-43 (and English translation).

Office Action issued on Aug. 4, 2009 from the Japanese Patent Office for the corresponding Japanese patent application No. 2005-331216 (with English translation).

* cited by examiner

METHOD FOR SEPARATING A SEMICONDUCTOR SUBSTRATE INTO A PLURALITY OF CHIPS ALONG WITH A CUTTING LINE ON THE SEMICONDUCTOR SUBSTRATE

CROSS REFERENCE TO RELATED APPLICATIONS

This application is based on Japanese Patent Applications No. 2005-331214 filed on Nov. 16, 2005, No. 2005-331215 filed on Nov. 16, 2005, and No. 2005-331216 filed on Nov. 16, 2005, the disclosures of which are incorporated herein by reference.

FIELD OF THE INVENTION

The present invention relates to a separating device for separating a semiconductor substrate and a method for separating the same.

BACKGROUND OF THE INVENTION

In recent years, in a dicing process for separating a silicon wafer (hereinafter called a wafer) forming a semiconductor integrated circuit and MEMS (Micro Electro Mechanical Systems) into respective semiconductor chips, consideration and research of a dicing process (laser dicing) using a laser beam are advanced. For example, a processing technique of the wafer using a laser is disclosed in JP-A-2002-192367. FIGS. 9A and 9B are explanatory views showing the dicing process using the laser beam. FIG. 9A is an explanatory view of a reforming area forming process using irradiation of the laser beam. FIG. 9B is an explanatory view of a divisional cutting process.

As shown in FIG. 9A, a laser head H for irradiating the laser beam L has a condenser lens CV for converging the laser beam L, and can converge the laser beam L at a predetermined focal distance. In the reforming area forming process, the laser head H is moved along a divisional cutting schedule line DL (in the direction of this side in FIGS. 9A and 9B) for divisionally cutting the wafer W in a laser beam irradiating condition set such that a convergent point P of the laser beam L is formed in a position of depth d from a substrate face of the wafer W. The laser beam L is irradiated from the substrate face of the wafer W. Thus, a reforming area K using multiphoton absorption is formed in a path of depth d in which the convergent point P of the laser beam L is scanned. When a foreign substance is attached onto the divisional cutting schedule line DL, the irradiation of the laser beam L is obstructed. Therefore, it is necessary to remove the foreign substance.

Here, the multiphoton absorption is that a substance absorbs plural photons of the same kind or different kinds. A phenomenon called optical damage is generated by this multiphoton absorption at the convergent point P of the semiconductor substrate W and its vicinity. Thus, thermal strain is induced, and a crack is generated in its portion. A layer constructed by gathering these cracks, i.e., the reforming area K is formed.

When the laser beam L is a pulse wave, intensity of the laser beam L is determined by peak power density (W/cm$^2$) of the convergent point P. For example, the multiphoton absorption is generated in a condition in which peak power density is $1\times10^8$ (W/cm$^2$) or more and pulse width is 1 μs or less. For example, a laser beam using a YAG (Yttrium Aluminum Garnet) laser is used as the laser beam L. For example, the wavelength of this laser beam L is a wavelength of 1064 nm in an infrared light area.

Subsequently, as shown in FIG. 9B, stress is loaded in an in-plane direction (direction shown by arrows F2 and F3 in this figure) of the semiconductor substrate W. Thus, a crack C is developed in the substrate thickness direction with the reforming area K as a starting point, and the semiconductor substrate W is divisionally cut along the divisional cutting schedule line DL. At a divisional cutting time, one portion of the semiconductor substrate W is chipped, and dust is generated. When this dust is attached to the substrate face, there is a fear that this dust has a bad influence on a product. Therefore, it is necessary to remove this dust.

As a method for removing an attachment substance such as dust, a foreign substance, etc. mentioned above, a technique for removing the attachment substance by suction and a technique for blowing-off the attachment substance by air cleaning are disclosed in, for example, JP-A-2003-10986 and JP-A-2003-10992.

However, in the removal using suction, there is a problem of a fear that the attachment substance is moved in a wide range along the semiconductor substrate at a sucking time, and has a bad influence such as damage of a product, etc. There is also a problem that the attachment substance can be removed in only a narrow area near a sucking portion, and removing efficiency is bad. Further, in the air cleaning, there is a problem of a fear that the attachment substance is moved in a wide range along the semiconductor substrate, and has a bad influence such as damage of a product, etc.

Further, a manufacturing device of a semiconductor chip is formerly used in manufacture of the semiconductor chip. In this manufacturing device, with respect to the semiconductor substrate of a state diced on a divisional scheduled line and stuck to a sheet, this sheet is extended and enlarged, and the semiconductor substrate is divided into semiconductor chips by loading stress in a planar direction of the semiconductor substrate. FIGS. 16A and 16B show one example of a former manufacturing device of the semiconductor chip. FIG. 16A is an explanatory view of a state in which the semiconductor substrate is adhered to the sheet and an outer circumferential portion of the sheet is held in a frame. FIG. 16B is an explanatory view of a process for dividing the semiconductor substrate into semiconductor chips by a pressing device.

As shown in FIG. 16A, the substrate face of a rear face of the semiconductor substrate, i.e., the semiconductor wafer W constructed by a semiconductor of silicon, etc. is adhered to the sheet S manufactured by resin and having a drawing property in a state in which laser dicing, etc. are performed. An outer circumferential portion of the sheet S is held by a frame F of an annular shape.

As shown in FIG. 16B, the semiconductor substrate W is pressed so as to be pushed up from the rear side of the sheet S by using a pressing device PD arranged below the semiconductor substrate W and moved in the vertical direction by an unillustrated moving means. Thus, the sheet S is extended in the planar direction (the directions of arrows F11 and F12 in FIG. 16B). Thus, stress is loaded to the semiconductor substrate W adhered to the sheet S in the planar direction. Therefore, the semiconductor substrate W is divided into plural semiconductor chips C. The above device is disclosed in JP-A-2003-334675.

However, in the former manufacturing device of the semiconductor chip, the sheet S is extended in a state in which the outer circumference of the sheet S is held. Therefore, the extension of the sheet S tends to become large toward its outer circumferential portion, and the extension of the sheet S tends to become small in its central portion. Namely, the semiconductor substrate W is properly divided in the vicinity of the outer circumference, but no semiconductor substrate W is easily divided in the vicinity of the center. Therefore, a problem exists in that yield of the semiconductor chip C is reduced.

Further, it is preferable to uniformly extend the sheet S so as to improve yield for obtaining the semiconductor chip C by divisionally cutting the semiconductor substrate W. However, in the former divisional cutting device of the semiconductor substrate, the sheet S is extended in a holding state of the outer circumference of the sheet S. Therefore, the extension of the sheet S tends to become large toward its outer circumferential portion, and tends to become small in its central portion. Namely, the semiconductor substrate W is properly divisionally cut near the outer circumference, but is not easily divisionally cut near the center. Therefore, a problem exists in that yield of the semiconductor chip C is reduced.

SUMMARY OF THE INVENTION

In view of the above-described problem, it is an object of the present disclosure to provide a separating device for separating a semiconductor substrate. It is another object of the present disclosure to provide a method for separating a semiconductor substrate.

According to a first aspect of the present disclosure, a separating device for separating a semiconductor substrate includes: a cutting element for cutting the semiconductor substrate into a plurality of chips along with a cutting line on the semiconductor substrate; an adsorbing element for adsorbing a dust on a surface of the semiconductor substrate by using electrostatic force; and a static electricity generating element for generating static electricity and for controlling the static electricity in order to remove the dust from the adsorbing element.

In the above device, it is possible to realize a divisional cutting device of the semiconductor substrate able to efficiently remove the attachment substance attached to the substrate face of the semiconductor substrate without having any bad influence on a product.

According to a second aspect of the present disclosure, a method for separating a semiconductor substrate includes: cutting the semiconductor substrate into multiple chips along with a cutting line on the semiconductor substrate; adsorbing a dust on a surface of the semiconductor substrate by using electrostatic force; and controlling static electricity in order to adsorb the dust and to remove the dust from the adsorbing element.

In the above method, it is possible to realize a divisional cutting method of the semiconductor substrate able to efficiently remove the attachment substance attached to the substrate face of the semiconductor substrate without having any bad influence on a product.

According to a third aspect of the present disclosure, a separating device for separating a semiconductor substrate into a plurality of chips along with a cutting line on the semiconductor substrate is provided. The semiconductor substrate includes a region capable of reducing a stress for separating the semiconductor substrate, and the region is disposed along with the cutting line. The device includes: a holding element for holding a part of the semiconductor substrate, the part which corresponds to one of the chips and are surrounded with the cutting line; and a force applying element for applying a force to the part of the semiconductor substrate through the holding element in order to separate the one of the chips from the semiconductor substrate.

In the above device, it is possible to realize a manufacturing device of the semiconductor chip able to improve yield of the semiconductor chip obtained by dividing the semiconductor substrate.

According to a fourth aspect of the present disclosure, a method for separating a semiconductor substrate includes: preparing the semiconductor substrate having first and second surfaces, wherein a plurality of semiconductor elements is disposed on the first surface of the semiconductor substrate; cutting the semiconductor substrate into multiple chips along with a cutting line on the semiconductor substrate, wherein each chip includes at least one semiconductor element; forming a region for reducing a stress in order to separate the semiconductor substrate, wherein the region is disposed along with the cutting line; attaching a holding element on a part of the semiconductor substrate, the part which corresponds to one of the chips and are surrounded with the cutting line; and applying a force to the part of the semiconductor substrate through the holding element in order to separate the one of the chips from the semiconductor substrate.

In the above method, it is possible to realize a manufacturing method of the semiconductor chip able to improve yield of the semiconductor chip obtained by dividing the semiconductor substrate.

According to a fifth aspect of the present disclosure, a separating device for separating a semiconductor substrate into a plurality of chips along with a cutting line on the semiconductor substrate includes: a sheet for bonding the semiconductor substrate thereon; a frame for holding a periphery of the sheet; and a pressing element for locally pressing the sheet from a side of the sheet opposite to the semiconductor substrate. The sheet is expanded so that the semiconductor substrate is separated into the chips when the pressing element presses the sheet.

In the above device, it is possible to realize the divisional cutting device of the semiconductor substrate able to improve yield of the semiconductor chip obtained by divisionally cutting the semiconductor substrate.

According to a sixth aspect of the present disclosure, a method for separating a semiconductor substrate into a plurality of chips along with a cutting line on the semiconductor substrate is provided. The method includes: bonding the semiconductor substrate to a sheet; holding a periphery of the sheet with a frame; and locally pressing the sheet from a side of the sheet opposite to the semiconductor substrate so that the sheet is expanded and the semiconductor substrate is separated into the chips.

In the above method, it is possible to realize the divisional cutting method of the semiconductor substrate able to improve yield of the semiconductor chip obtained by divisionally cutting the semiconductor substrate.

BRIEF DESCRIPTION OF THE DRAWINGS

The above and other objects, features and advantages of the present invention will become more apparent from the following detailed description made with reference to the accompanying drawings. In the drawings.

Figure 17A:
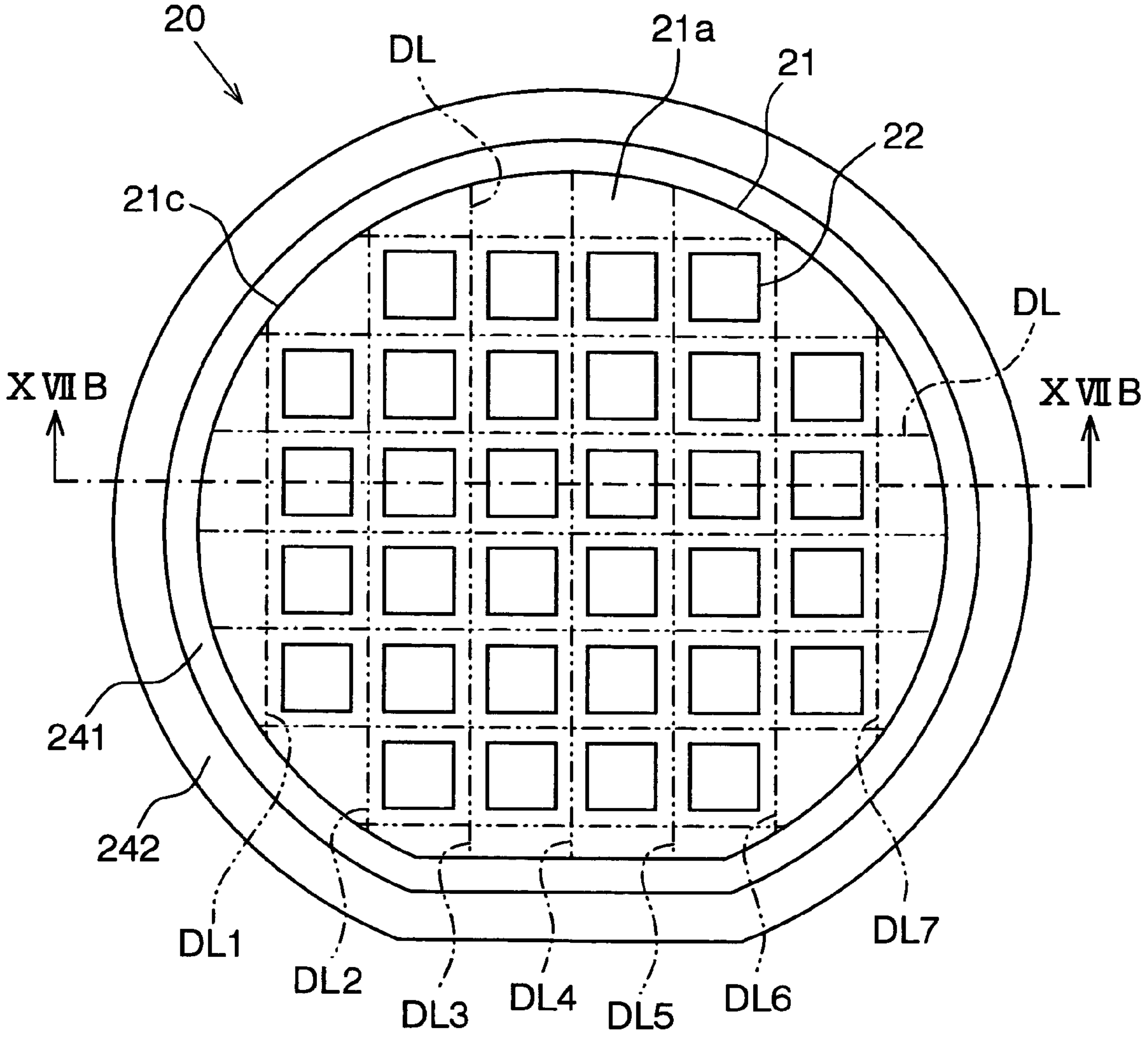
Figure 17B:
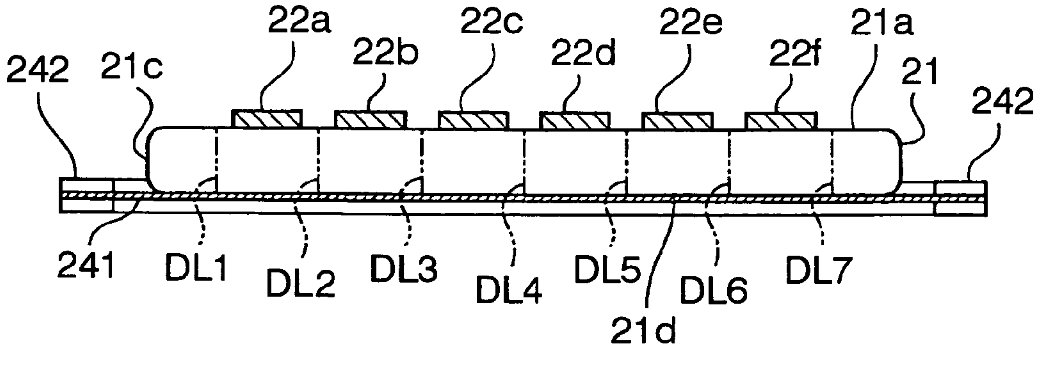
Figure 18:
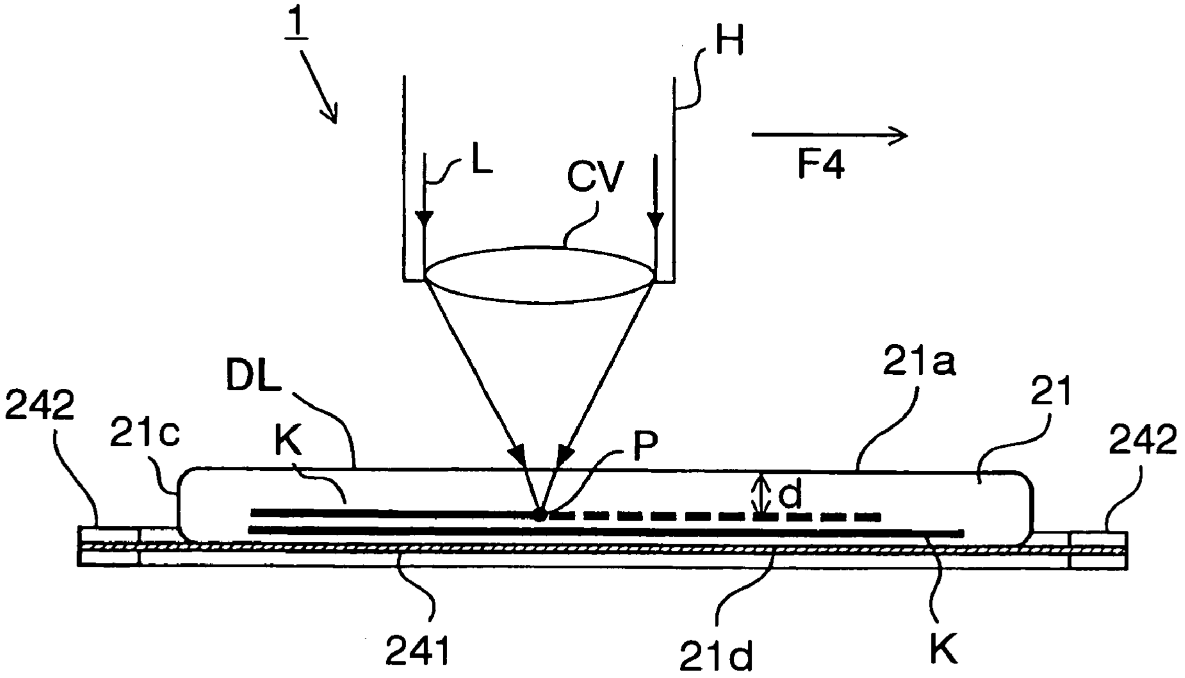
Figure 19A:
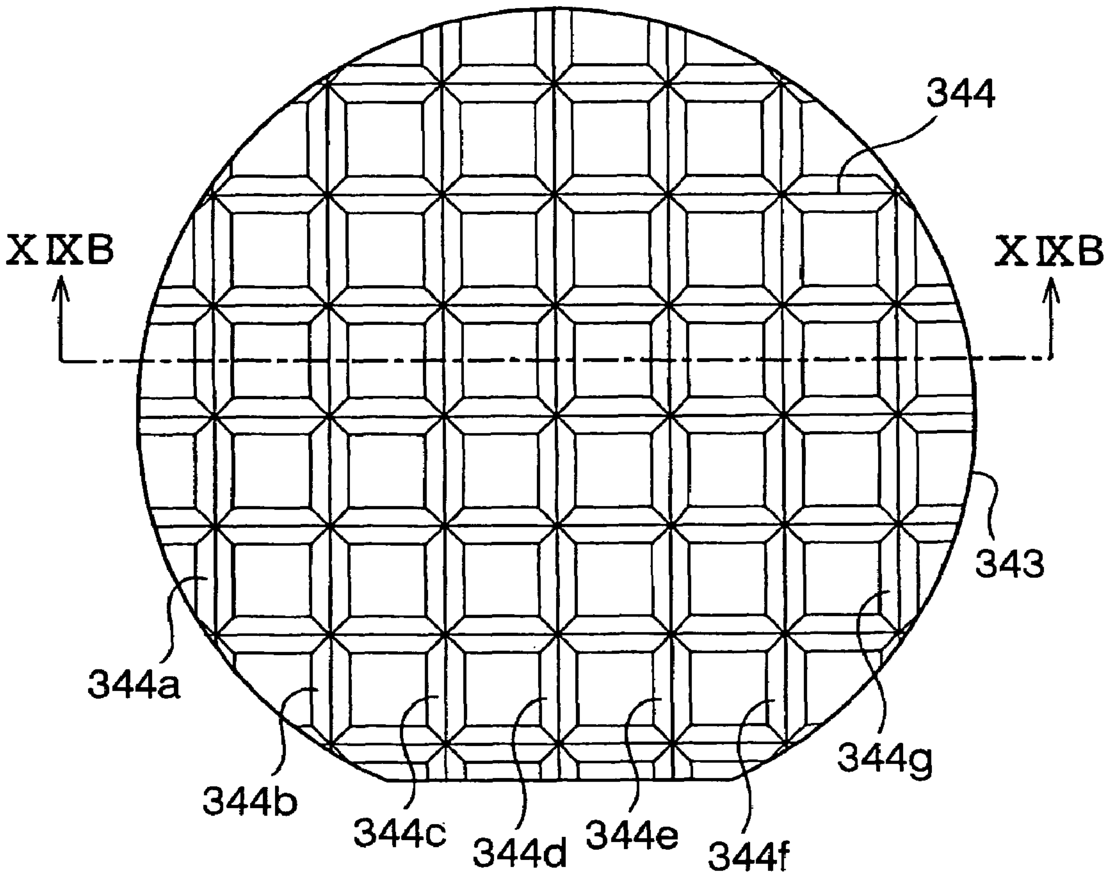
Figure 19B:
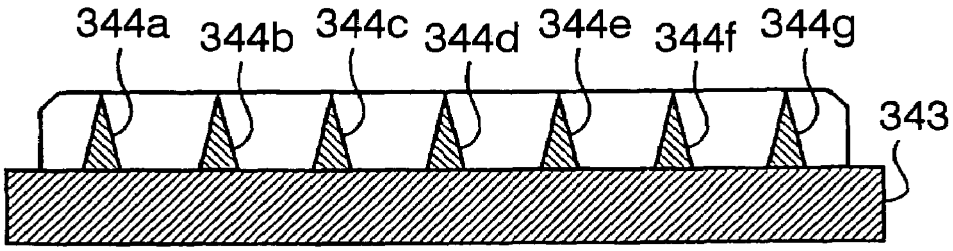
Figure 20A:
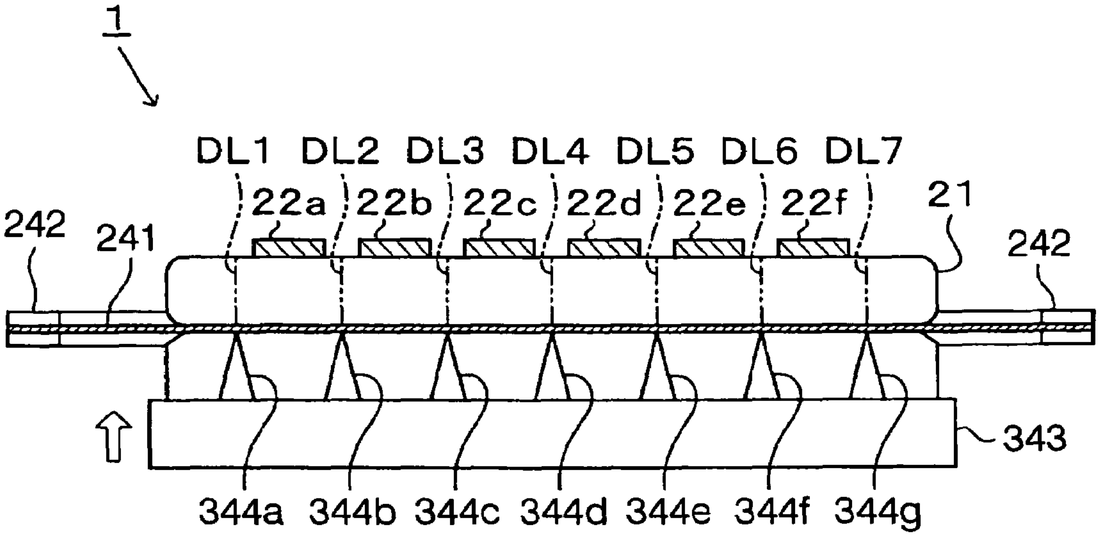
Figure 20B:
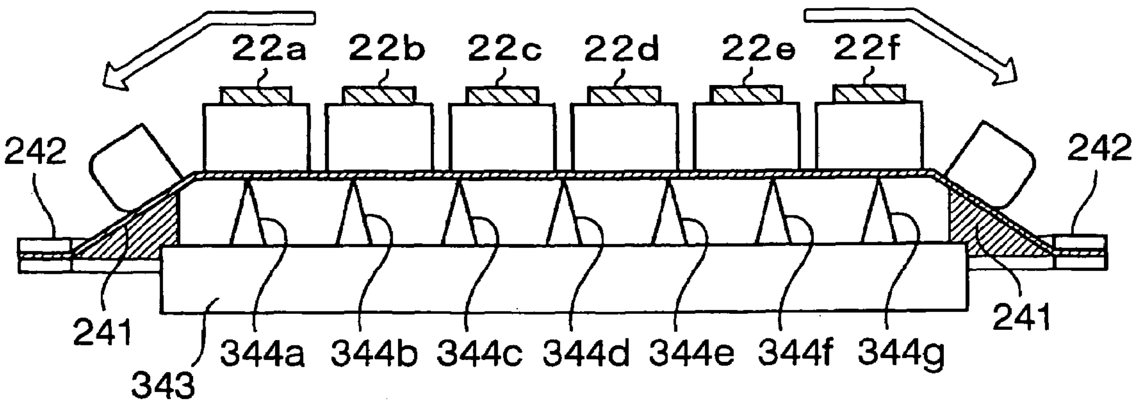
Figure 21A:
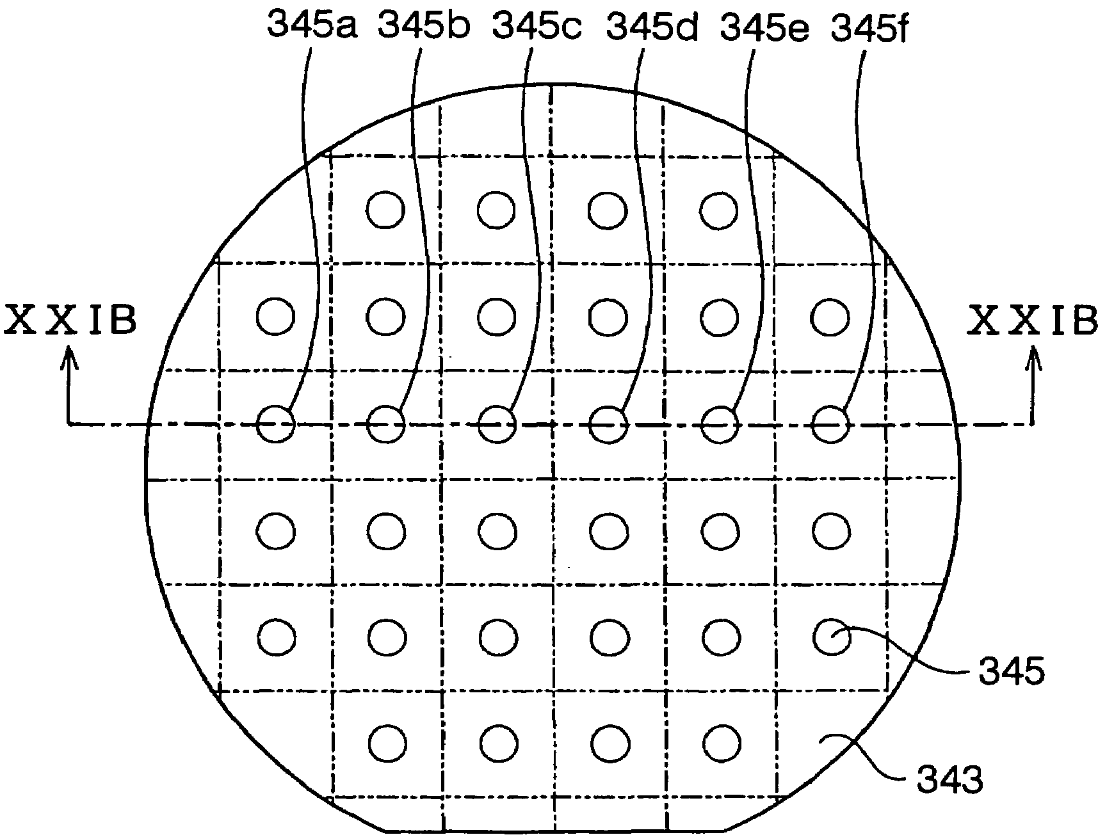
Figure 21B:
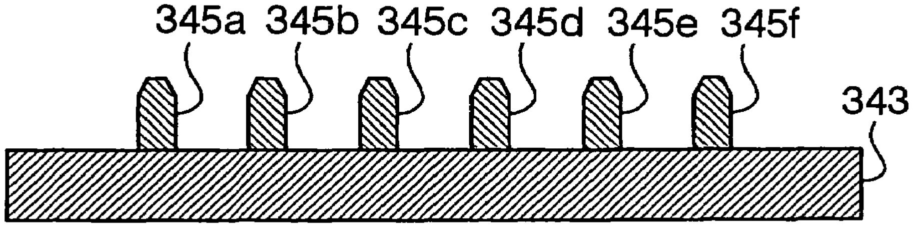
Figure 22A:
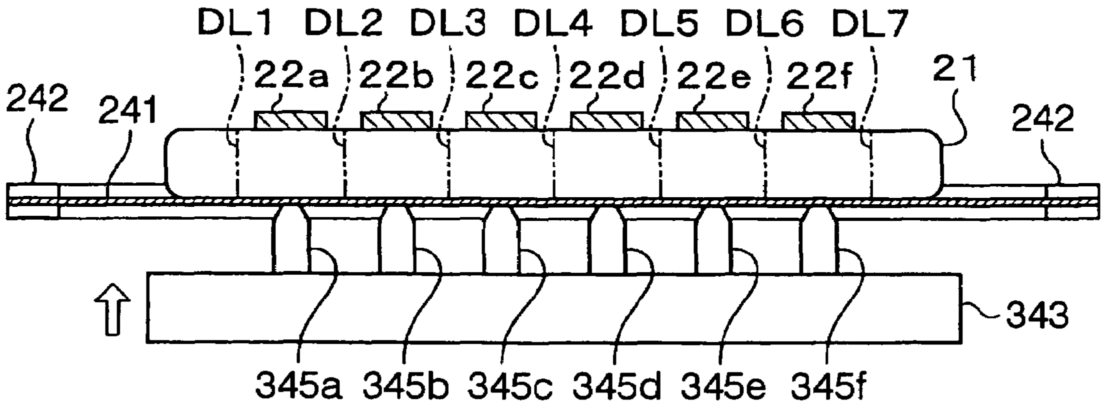
Figure 22B:
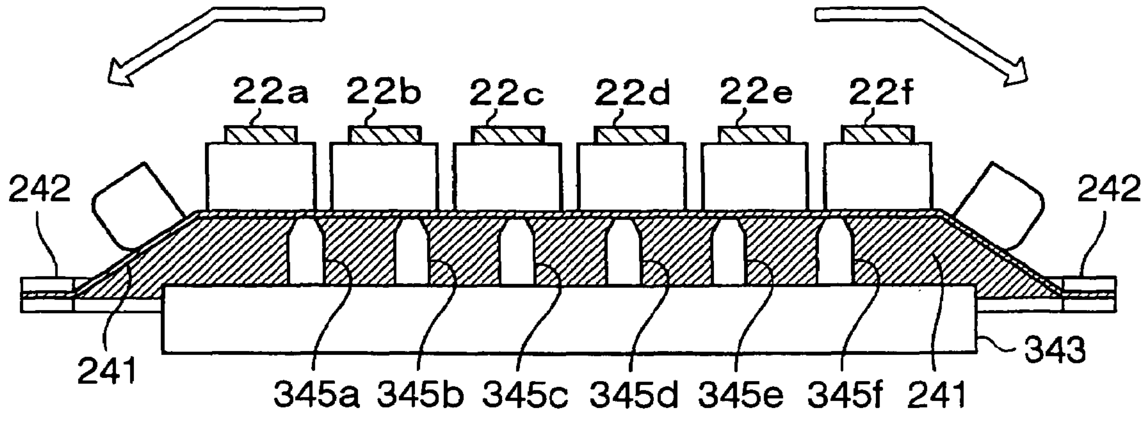

16A and 16B are cross sectional views explaining a method for separating a semiconductor wafer into multiple chips according to a prior art;

FIG. 17A is a plan view showing a semiconductor wafer, and FIG. 17B is a cross sectional view showing the wafer taken along line XVIIB-XVIIB in FIG. 17A;

FIG. 18 is a cross sectional view showing a dicing device by using a laser beam;

FIG. 19A is a plan view showing a pressing device, and FIG. 19B is a cross sectional view showing the device taken along line XIXB-XIXB in FIG. 19A;

FIGS. 20A and 20B are cross sectional views explaining a method for separating the wafer by using the pressing device in FIGS. 19A and 19B;

FIG. 21A is a plan view showing another pressing device, and FIG. 21B is a cross sectional view showing the device taken along line XXIB-XXIB in FIG. 21A;

FIGS. 22A and 22B are cross sectional views explaining a method for separating the wafer by using the pressing device in FIGS. 21A and 21B;

FIGS. 23A to 23D are cross sectional views explaining a method for separating a wafer by using another pressing device;

FIGS. 24A to 24D are cross sectional views explaining a method for separating a wafer by using further another pressing device; and FIGS. 25A to 25D are cross sectional views explaining a method for separating a wafer by using another pressing device.

DETAILED DESCRIPTION OF THE PREFERRED EMBODIMENTS

First Embodiment Mode

Figure 1A:
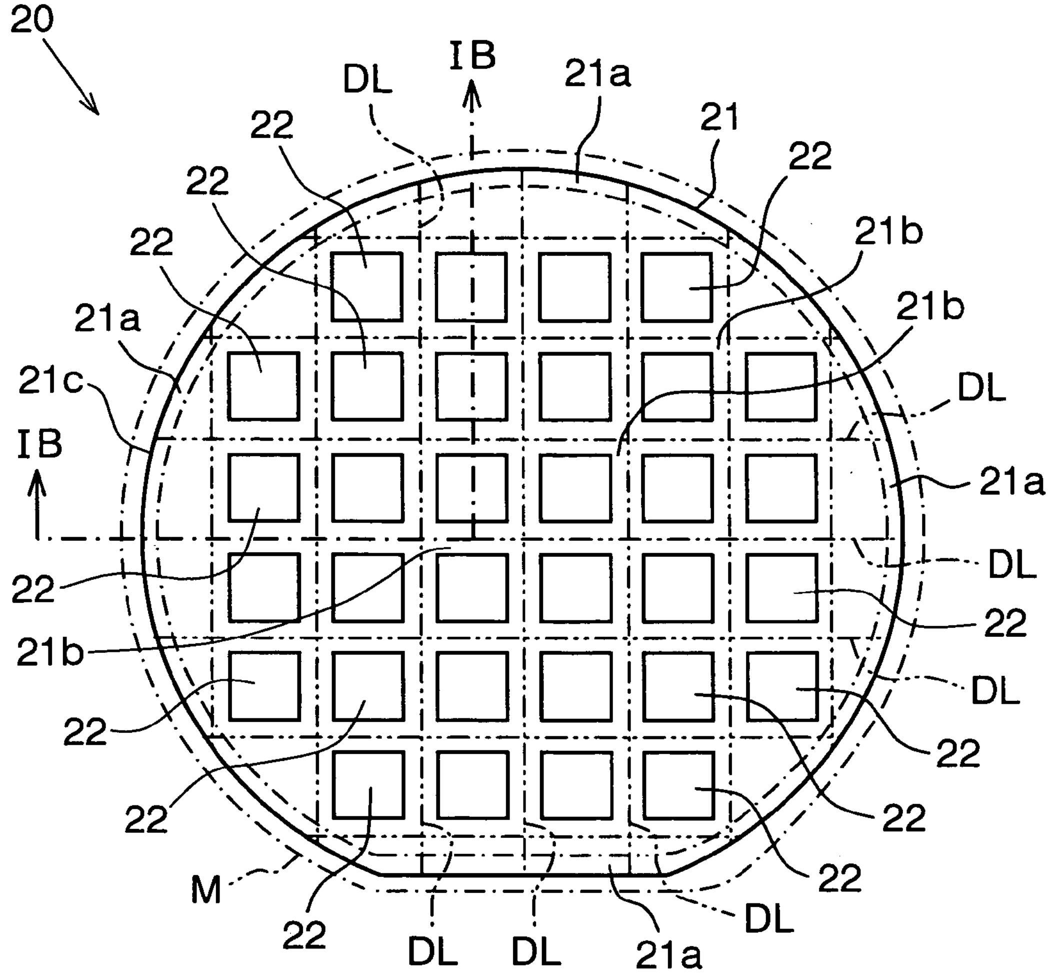
FIG. 1A is a plan view showing a wafer.
Figure 1B:
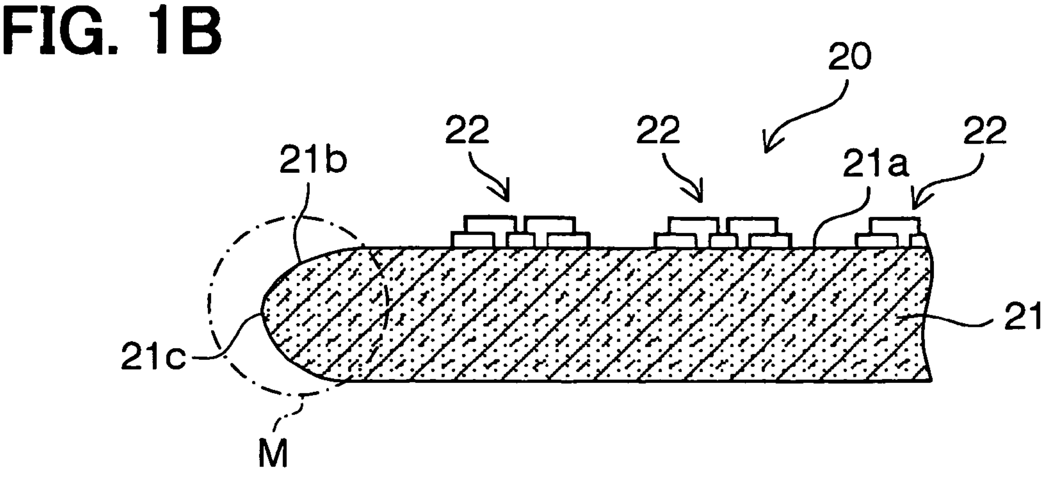
FIG. 1B is a cross sectional view showing the wafer taken along line IB-IB in FIG. 1A.
Figure 2:
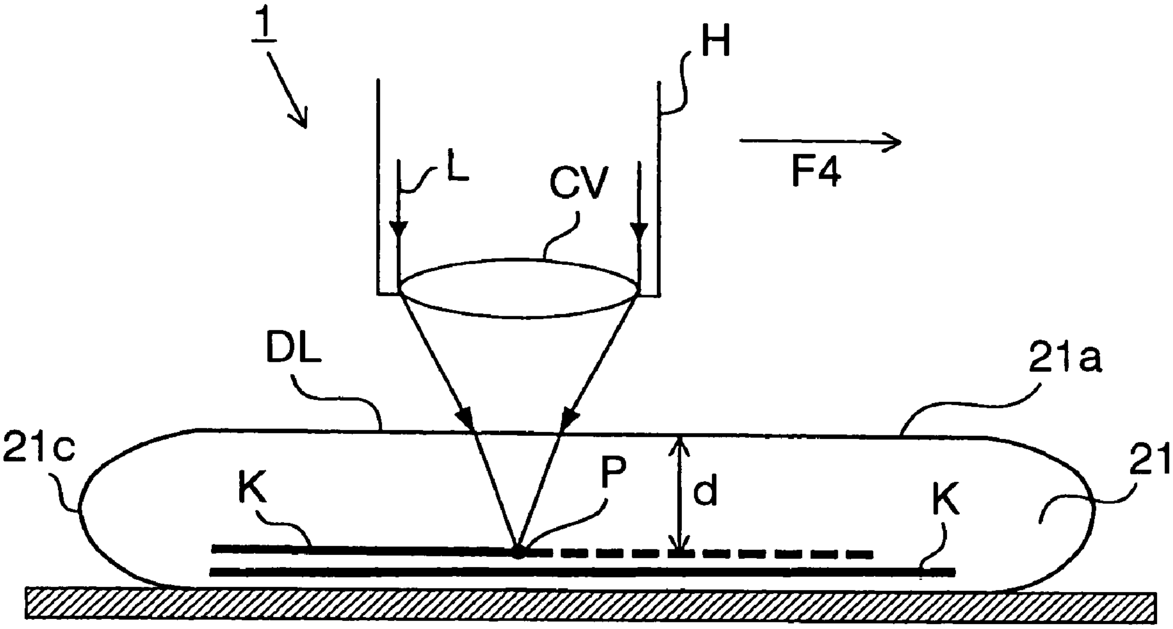
FIG. 2 is a schematic cross sectional view showing a dicing device for irradiating a laser beam on a semiconductor substrate.
Figure 3A:
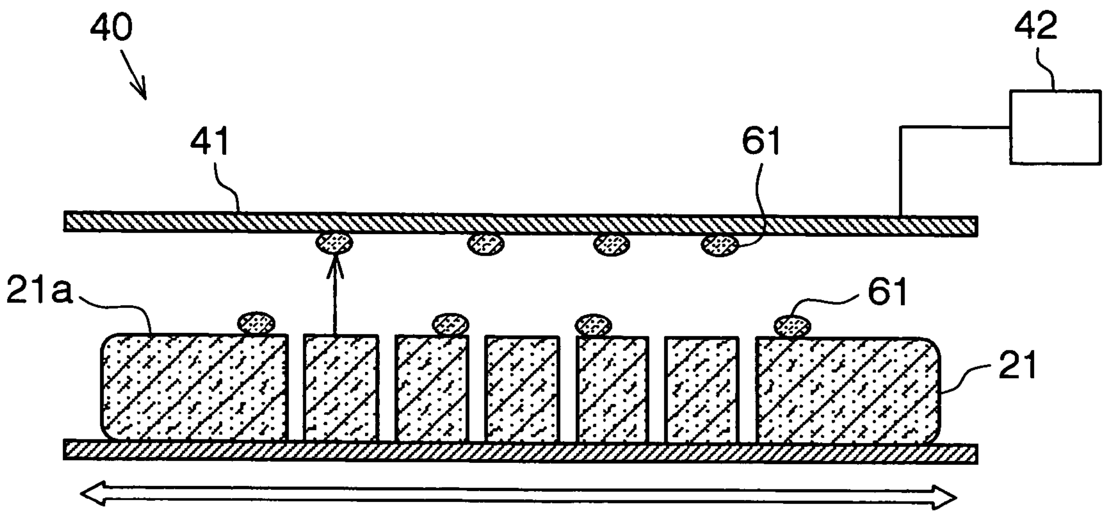
FIG. 3A is a cross sectional view showing an attachment substance removing device.
Figure 3B:
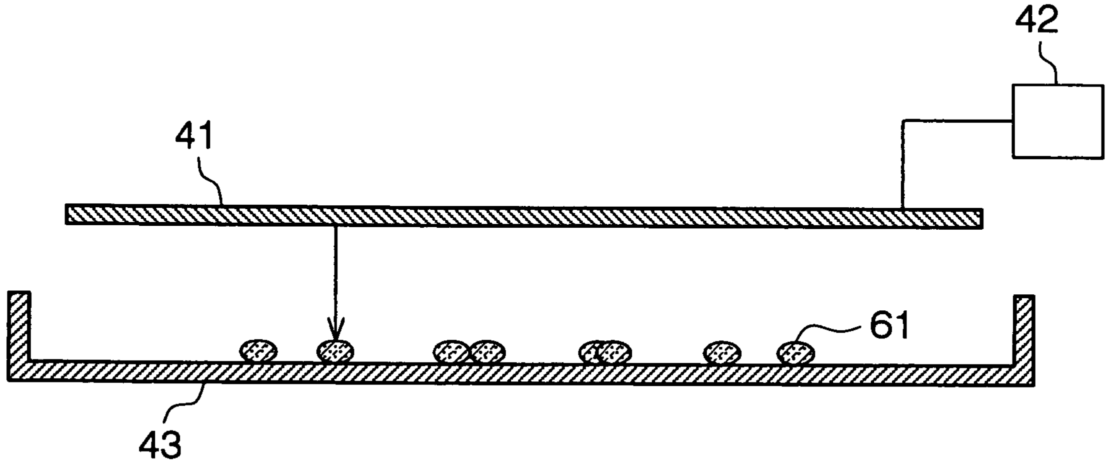
FIG. 3B is a cross sectional view showing an attachment substance collecting member in the device.

A first embodiment mode of a divisional cutting device and a divisional cutting method of a semiconductor substrate will be explained with reference to the drawings. FIGS. 1A and 1B are typical views showing a constructional example of the semiconductor substrate divisionally cut by the divisional cutting device of the semiconductor substrate. FIG. 1A is a plan explanatory view of the surface of a wafer. FIG. 1B is a sectional enlarged view seen from arrow IB-IB of FIG. 1A. FIG. 2 is an explanatory view of the divisional cutting device for irradiating a laser beam to the semiconductor substrate. FIGS. 3A and 3B are explanatory views of an attachment substance removing device. FIG. 3A is an explanatory view of a method for removing dust attached to a substrate face by using the attachment substance removing device. FIG. 3B is an explanatory view of a method for collecting the dust removed from the substrate face.

In each of these figures, one portion is enlargedly and exaggeratedly shown for the explanation.

A wafer 20 is prepared as shown in FIG. 1A. A semiconductor substrate 21 of a thin disk shape constructed by silicon is arranged in the wafer 20. An orientation flat showing a crystal orientation is formed in one portion of the outer circumference of the semiconductor substrate 21. Plural chips 22 formed via a diffusion process, etc. are lined up and are arranged as in checkers on a substrate face 21*a* of this semiconductor substrate 21. These chips 22 are respectively divisionally cut along a divisional cutting schedule line DL (i.e., a dicing line or a cutting line) by a dicing process, and are then completed as packaged IC and LSI via respective processes of a mount process, a bonding process, an enclosing process, etc. In this embodiment mode, a silicon layer as a support substrate of the chip 22 can be formed in the semiconductor substrate 21.

As shown in FIG. 1B, a chamfer portion 21*b* chamfered in the outer circumference is formed in the semiconductor substrate 21 to prevent chipping of an outer circumferential edge portion M.

As shown in FIG. 2, a laser head H for irradiating a laser beam L is arranged in the divisional cutting device 1 of the semiconductor substrate 21. The laser head H has a condenser lens CV for converging the laser beam L, and can converge the laser beam L at a predetermined focal distance. Here, a convergent point P (i.e., a focus point) of the laser beam L is set so as to be formed in a position of depth d from the substrate face 21*a* of the semiconductor substrate 21.

One of divisional cutting schedule lines DL shown in FIG. 1A is first scanned by the laser beam for wafer detection to form a reforming layer K within the semiconductor substrate 21. Then, an outer circumferential end portion 21*c* shown in FIG. 1B is detected, and a scanning range of the laser beam L is set.

Subsequently, as shown in FIG. 2, the laser head H is scanned along the divisional cutting schedule line DL (the direction of arrow F4 in this figure), and the laser beam L is irradiated from the substrate face 21*a*. Thus, a reforming area K is properly formed in a path of depth d in which the convergent point P of the laser beam L is scanned.

Here, reforming areas K of an arbitrary layer number can be formed at an arbitrary depth within a thickness range of the semiconductor substrate 21 by adjusting the depth d of the convergent point P of the laser beam L. For example, when the thickness is comparatively thick, the convergent point P is moved in its thickness direction and the reforming area K is formed in a continuous shape in the thickness direction, or plural portions so that the semiconductor substrate 21 can be easily divisionally cut.

Figure 9A:
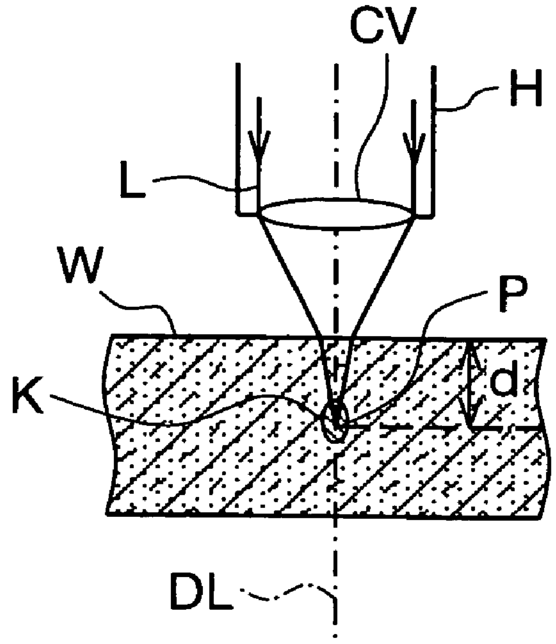
FIG. 9A is a cross sectional view showing a method for forming a reforming area by using a laser beam.
Figure 9B:
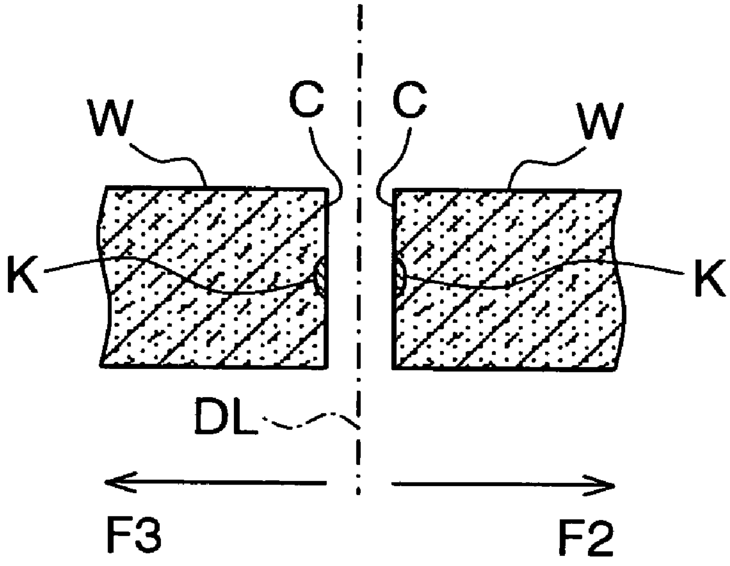
FIG. 9B is a cross sectional view showing a method for dicing a semiconductor wafer.

Subsequently, similar to the background art shown in FIG. 9B, a crack is developed in the substrate thickness direction with the reforming area K as a starting point by loading stress in an in-plane direction of the semiconductor substrate 21. Then, the semiconductor substrate 21 can be easily divisionally cut along the divisional cutting schedule line DL (divisional cutting process).

Subsequently, as shown in FIG. 3A, a dust 61 generated from the semiconductor substrate 21 near the divisional cutting schedule line DL and attached to the substrate face 21*a* is removed by using an attachment substance removing device 40. The attachment substance removing device 40 has an adsorbing member 41 for adsorbing the dust 61 by electrostatic force, and an electrostatic generator 42 electrically connected to the adsorbing member 41. The electrostatic generator 42 induces static electricity in the adsorbing member 41 by applying a voltage to the adsorbing member 41, and generates electrostatic force.

The adsorbing member 41 is formed in a plate shape by using a member having an electrically conductive property, e.g., a metallic thin plate, metallic meshes, electrically conductive resin, etc. The adsorbing member 41 is opposed to the substrate face 21*a* of the semiconductor substrate 21 and is formed at a size for covering the entire substrate face 21*a*, and a face opposed to the semiconductor substrate 21 is set to a face for adsorbing an attachment substance.

First, the adsorbing member 41 is arranged in an upper portion separated by a predetermined distance from the substrate face 21*a* of the divisionally cut semiconductor substrate 21.

Next, a voltage is applied to the adsorbing member 41 by the electrostatic generator 42, and static electricity is induced in the adsorbing member 41 so that electrostatic force is generated (static electricity generating process). Thus, the dust 61 attached to the substrate face 21*a* of the semiconductor substrate 21 is pulled upward by the electrostatic force, and is adsorbed to the adsorbing member 41, and is removed from the substrate face 21*a* (adsorbing process).

Subsequently, as shown in FIG. 3B, in a state in which dust 61 is adsorbed to the adsorbing member 41, the adsorbing member 41 is moved by an unillustrated moving mechanism from an upper portion of the semiconductor substrate 21 to an upper portion of an attachment substance collecting member 43. The electrostatic force of the adsorbing member 41 is then eliminated by releasing the application of the voltage to the adsorbing member 41, and the dust 61 is dropped and collected in the attachment substance collecting member 43.

Here, when the voltage of polarity reverse to that of the voltage applied at an adsorbing time is applied to the adsorbing member 41, the dust 61 electrically charged is repulsed with respect to the adsorbing member 41. Therefore, the dust 61 can be further efficiently collected. Further, the dust 61 left in the adsorbing member 41 may be also removed by suction. Further, an adhesive face of an adhesive sheet may be pressed against the adsorbing member 41, and the dust 61 may be adhered to the adhesive sheet and may be also removed.

Further, the dust 61 can be also adsorbed and removed from the adsorbing member 41 by constructing the attachment substance collecting member 43 by an adsorbing member for adsorbing the dust 61 by electrostatic force, and generating electrostatic force by an unillustrated electrostatic generator.

In this embodiment mode, the laser dicing method for irradiating the laser beam from the substrate face and forming the reforming area within the semiconductor substrate is illustrated as a divisional cutting method of the semiconductor substrate. Alternatively, for example, after a notch is formed in the semiconductor substrate by a diamond blade, the attachment substance removing device of this embodiment mode can be also applied to a divisional cutting device for divisionally cutting the semiconductor substrate by loading stress. Further, after the notch is formed in the semiconductor substrate by the diamond blade, the attachment substance removing device can be also applied to a divisional cutting device for divisionally cutting the semiconductor substrate by performing laser dicing and loading stress.

The effect of the above cutting device 1 is as follows.

(1) In accordance with the divisional cutting device 1 and the divisional cutting method of the semiconductor substrate 21 in the first embodiment mode, the attachment substance removing device 40 having the adsorbing member 41 and the electrostatic generator 42 is arranged. The adsorbing member 41 adsorbs dust 61 attached to the substrate face 21*a* of the semiconductor substrate 21 by electrostatic force. The electrostatic generator 42 induces static electricity in this adsorbing member 41, and controls the magnitude of electrostatic force. Therefore, dust 61 attached to the substrate face 21*a* of the semiconductor substrate 21 can be efficiently removed without moving dust 61 in a wide range.

Accordingly, it is possible to realize the divisional cutting device 1 and the divisional cutting method of the semiconductor substrate 21 able to efficiently remove the dust 61 attached to the substrate face 21*a* of the semiconductor substrate 21 without having any bad influence on a product.

(2) Since the attachment substance collecting member 43 for separating dust 61 adsorbed by the adsorbing member 41 from the adsorbing member 41 is arranged, the surface of the adsorbing member 41 can be cleaned and no adsorption force is reduced. Further, it is possible to reliably prevent that the collected dust 61 is again attached to the substrate face 21*a*, and dust 61 can be efficiently collected.

Second Embodiment Mode

A second embodiment mode of the divisional cutting device and the divisional cutting method of the semiconductor substrate will be explained with reference to the drawings.

Figure 4A:
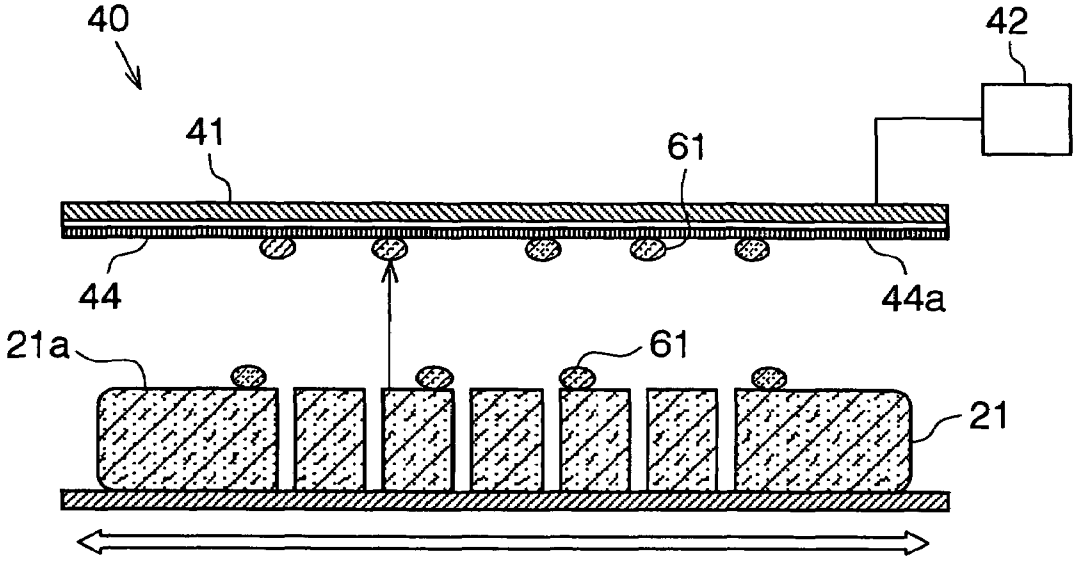
FIG. 4A is a cross sectional view explaining a method for adhering dust on an adhesive member.
Figure 4B:
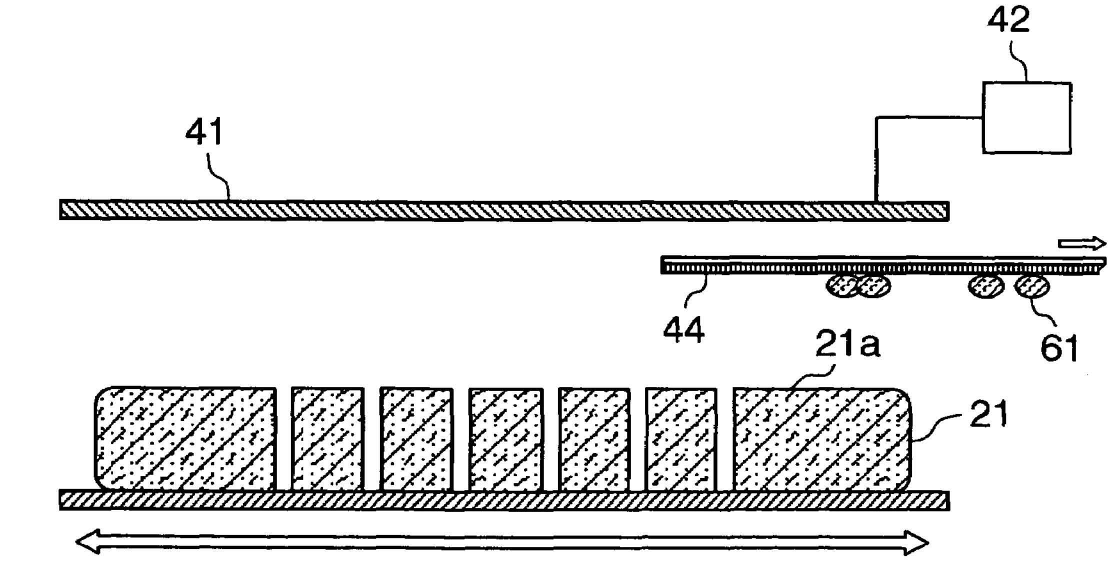
FIG. 4B is a cross sectional view explaining a method for collecting the dust removed from the substrate.

FIGS. 4A and 4B are explanatory views of a construction for removing dust 61 by using an adhesive member. FIG. 4A is an explanatory view of a method for attaching dust 61 removed from the substrate face 21*a* to the adhesive member. FIG. 4B is an explanatory view of a method for collecting a dust 61 removed from the substrate face 21*a*.

As shown in FIG. 4A, an adhesive member 44 formed by a material for shielding no electrostatic force is first arranged between the adsorbing member 41 and the substrate face 21*a*. The adhesive member 44 has an adhesive layer 44*a* for adhering the dust 61 onto a face of the substrate face 21*a* side, and is formed in a shape for covering an entire face of the adsorbing member 41.

Next, similar to the first embodiment mode, electrostatic force is generated in the adsorbing member 41 by the electrostatic generator 42, and the dust 61 is attracted upward. At this time, since the adhesive member 44 is arranged between the adsorbing member 41 and the substrate face 21*a*, the dust 61 collides with the adhesive layer 44*a* and is adhered.

Subsequently, as shown in FIG. 4B, in a state in which dust 61 is adhered to the adhesive member 44, only the adhesive member 44 is moved from a face of the substrate face 21*a* side of the adsorbing means 41, and is collected. After the adhesive member 44 is collected, a new adhesive member 44 is arranged between the adsorbing member 41 and the substrate face 21*a*. Thus, a new semiconductor substrate 21 is divisionally cut without moving the adsorbing member 41, and the dust 61 can be removed.

The above device has the following effect.

Since the adhesive member 44 having the adhesive layer 44*a* for catching the dust 61 on its lower face is arranged so as to cover a lower portion of the adsorbing member 41, the adsorbed dust 61 is adhered to the adhesive member 44, and can be collected by merely removing the adhesive member 44 so that dust 61 can be efficiently removed.

Third Embodiment Mode

Figure 5:
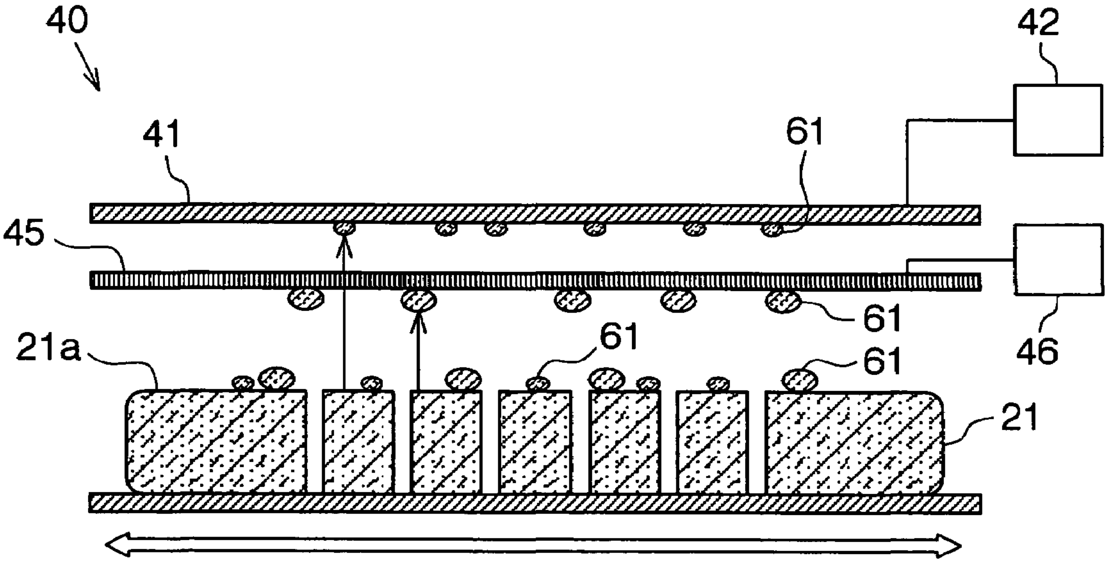
FIG. 5 is a cross sectional view explaining a method for removing the dust by using two adsorbing members stacked each other.

A third embodiment mode of the divisional cutting device and the divisional cutting method of the semiconductor substrate will be explained with reference to the drawings. FIG. 5 is an explanatory view of a construction for removing the dust 61 by using two laminated adsorbing members.

As shown in FIG. 5, a second adsorbing member 45 is first arranged between the adsorbing member 41 and the substrate face 21*a*. The second adsorbing member 45 is a mesh-shaped member having an electrically conductive property and formed in a shape for covering the entire face of the adsorbing member 41, and is electrically connected to a second electrostatic generator 46.

Next, a voltage applied to the second adsorbing member 45 by the second electrostatic generator 46 is set to become higher than the voltage applied to the adsorbing member 41 by the electrostatic generator 42. Electrostatic force using the second adsorbing member 45 is controlled so as to become greater than the electrostatic force using the adsorbing member 41. At this time, comparatively large dust 61 is adsorbed by the second adsorbing member 45, and the dust 61 passing through meshes of the second adsorbing member 45 is adsorbed to the adsorbing member 41.

Subsequently, in an adsorbing state of dust 61, the adsorbing member 41 and the second adsorbing member 45 are moved from an upper portion of the semiconductor substrate 21 to an upper portion of the attachment substance collecting member 43 (FIG. 3B). The dust 61 is then dropped from the adsorbing member 41 and the second adsorbing member 45 and is collected by releasing the application of the voltage using the electrostatic generator 42 and the second electrostatic generator 46.

Here, the dust 61 can be collected by various methods by controlling the application of the voltage using the electrostatic generator 42 and the second electrostatic generator 46. For example, after comparatively large dust 61 is collected by releasing the application of the voltage using the second electrostatic generator 46, small dust 61 can be collected by releasing the application of the voltage using the electrostatic generator 42. Further, the application of the voltage to the adsorbing member 41 using the electrostatic generator 42 is released, and a voltage is applied to the second adsorbing member 45 by the second electrostatic generator 46. Thus, after the dust 61 adsorbed to the adsorbing member 41 is adsorbed to the second adsorbing member 45, the dust 61 can be also removed by applying the voltage of polarity reverse to that of the voltage applied to the second adsorbing member 45.

The above device has the following effect.

Since the second adsorbing member 45 is a member of a mesh shape, the size of dust 61 can be distinguished by the adsorbing member 41 and the second adsorbing member 45. Further, the electric potential between the adsorbing member 41 and the second adsorbing member 45 can be changed by the electrostatic generator 42 and the second electrostatic generator 46. Therefore, the adsorbed dust 61 can be efficiently collected from the adsorbing member 41 and the second adsorbing member 45 by controlling the electric potential between the adsorbing member 41 and the second adsorbing member 45.

Fourth Embodiment Mode

In fourth and fifth embodiment modes shown below, the divisional cutting device 1 of the semiconductor substrate 21 for executing a method for removing a foreign substance in a reforming layer forming process using irradiation of the laser beam L will be explained.

Figure 6:
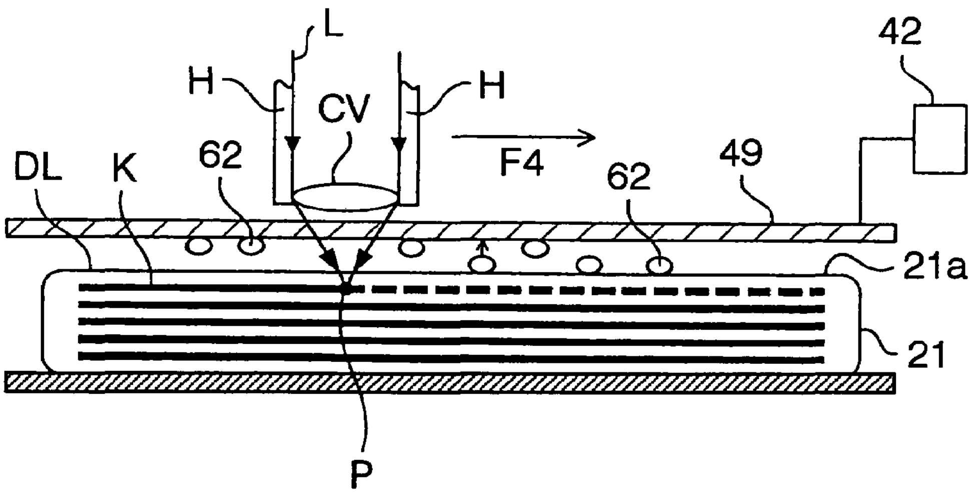
FIG. 6 is a cross sectional view explaining a method for removing a foreign substance by using a mesh adsorbing member.

A fourth embodiment mode of the divisional cutting device and the divisional cutting method of the semiconductor substrate will be explained with reference to the drawings. FIG. 6 is an explanatory view of a construction for removing a foreign substance by using an adsorbing member of a mesh shape.

As shown in FIG. 6, an adsorbing member 49 for adsorbing a foreign substance 62 attached to the substrate face 21*a* before irradiation of the laser beam L by electrostatic force is arranged between the laser head H and the substrate face 21*a* of the semiconductor substrate 21. The adsorbing member 49 is a mesh-shaped member opposed to the substrate face 21*a* of the semiconductor substrate 21 and formed in a shape for covering the entire substrate face 21*a*, and having an electrically conductive property. The adsorbing member 49 is electrically connected to the electrostatic generator 42.

Next, in a state in which a voltage is applied to the adsorbing member 49 by the electrostatic generator 42 and electrostatic force is generated, the laser head H is scanned along the divisional cutting schedule line DL (the direction of arrow F4 in FIG. 6). The laser beam L is then irradiated from the substrate face 21*a* through a mesh portion of the adsorbing member 49. Thus, the reforming area K is properly formed in a path of depth d in which the convergent point P of the laser beam L within the semiconductor substrate 21 is scanned.

Here, the reforming area K of an arbitrary layer number can be formed at an arbitrary depth within a thickness range of the semiconductor substrate 21 by adjusting the depth d of the convergent point P of the laser beam L. For example, when the thickness is comparatively thick, the semiconductor substrate 21 can be easily divisionally cut by moving the convergent point P in its thickness direction and forming the reforming area K in a continuous shape in the thickness direction, or forming the reforming area K in plural portions.

As mentioned above, while the laser beam L is irradiated to the substrate face 21*a*, a foreign substance 62 attached to the substrate face 21*a* can be removed. Therefore, the foreign substance 62 obstructing the irradiation of the laser beam L can be removed.

Subsequently, similar to the first embodiment mode, in a state in which the foreign substance 62 is adsorbed to the adsorbing member 41, the adsorbing member 41 is moved from an upward portion of the semiconductor substrate 21 to an upward portion of the attachment substance collecting member 43 (FIG. 3B), and the application of the voltage to the adsorbing member 49 is released. Thus, the foreign substance 62 is removed from the adsorbing member 49 and can be collected.

Further, the adhesive member 44 (FIGS. 4A and 4B) used in the second embodiment mode may be also arranged between the adsorbing member 49 and the substrate face 21*a*. At this time, the adhesive member 44 is formed by using a material for transmitting the laser beam L. When this construction is used, the adsorbed foreign substance 62 is adhered to the adhesive member 44, and can be collected by merely removing the adhesive member 44. Accordingly, the foreign substance 62 can be efficiently removed.

The above device 1 has the following effect.

While the laser beam L is irradiated to the substrate face 21*a*, the foreign substance 62 attached to the substrate face 21*a* can be removed. Therefore, even when the foreign substance 62 is attached onto the divisional cutting schedule line DL, the foreign substance 62 can be removed before the laser beam L is irradiated. Accordingly, no irradiation of the laser beam L can be obstructed. Further, an attachment substance generated from the semiconductor substrate 21 can be also removed by the irradiation of the laser beam L.

Fifth Embodiment Mode

Figure 7:
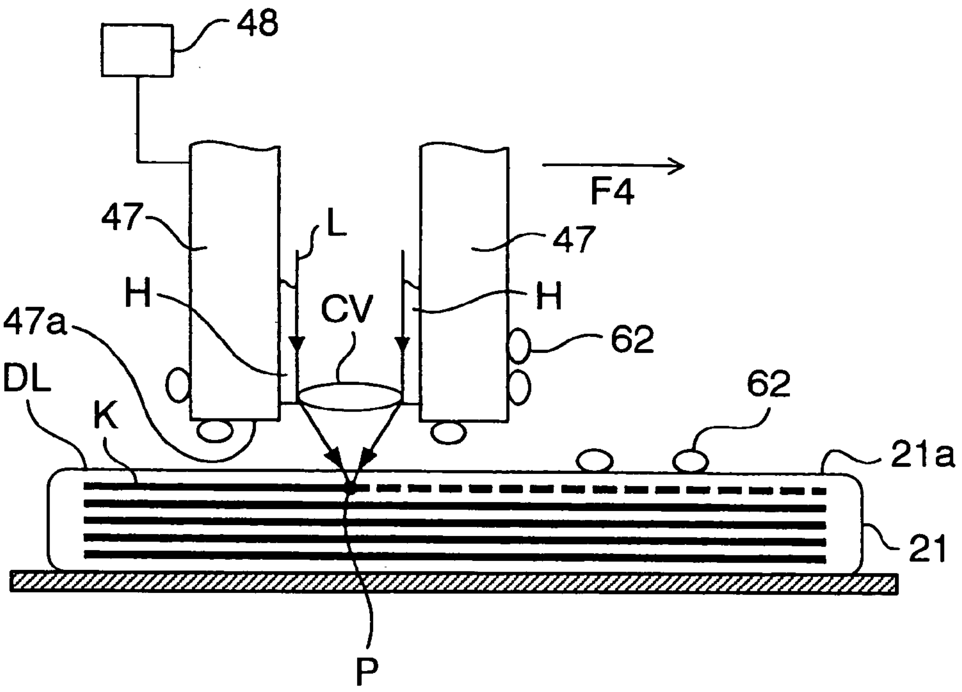
FIG. 7 is a cross sectional view showing an adsorbing member adjacent to a laser head.

A fifth embodiment mode of the divisional cutting device and the divisional cutting method of the semiconductor substrate will be explained with reference to the drawings. FIG. 7 is an explanatory view of a construction for arranging the adsorbing member adjacently to the laser head H.

As shown in FIG. 7, an adsorbing member 47 is formed in a cylindrical shape surrounding a side face of the laser head H, and is electrically connected to an electrostatic generator 48. A lower face 47*a* of the adsorbing member 47 has a width of the same degree as the diameter of the laser head H, and is opposed to the substrate face 21*a* and is flatly formed.

In a state in which a voltage is applied to the adsorbing member 47 by the electrostatic generator 48 and electrostatic force is generated, the laser head H is scanned along the divisional cutting schedule line DL (the direction of arrow F4 in FIG. 7), and the laser beam L is irradiated from the substrate face 21*a*. The adsorbing member 47 is moved together with the laser head H, and a foreign substance 62 attached to the substrate face 21*a* is adsorbed and removed. Therefore, even when the foreign substance 62 is attached onto the divisional cutting schedule line DL, the foreign substance 62 can be removed before the laser beam L is irradiated. Accordingly, the laser beam L is properly irradiated. Thus, the reforming area K is properly formed in a path of depth d in which the convergent point P of the laser beam L within the semiconductor substrate 21 is scanned.

Further, an attachment substance generated from the semiconductor substrate 21 can be also removed by the irradiation of the laser beam L.

Subsequently, in an adsorbing state of the foreign substance 62, the adsorbing member 47 is moved from an upward portion of the semiconductor substrate 21 to an upward portion of the attachment substance collecting member 43 (FIG. 3B) together with the laser head H, and the application of the voltage to the adsorbing member 47 is released. Thus, the foreign substance 62 is removed from the adsorbing member 47 and can be collected.

Here, when the voltage of polarity reverse to that of the voltage applied to the adsorbing member 47 is applied, the foreign substance 62 electrically charged is repulsed with respect to the adsorbing member 47. Therefore, the foreign substance 62 can be further efficiently removed. Further, the foreign substance 62 left in the adsorbing member 47 may be also removed by suction. Further, an adhesive face of an adhesive sheet may be pressed against the adsorbing member 47 and the foreign substance 62 may be adhered to the adhesive sheet and may be also removed.

Further, the foreign substance 62 can be also removed by constructing the attachment substance collecting member 43 by an adsorbing member for adsorbing the foreign substance 62 by electrostatic force, and generating electrostatic force by an unillustrated electrostatic generator, and adsorbing the foreign substance 62 from the adsorbing member 47.

The above device has the following effect.

The adsorbing member 47 is moved in association with the laser head H, and the foreign substance 62 attached to the substrate face 21*a* of a scanning direction of the laser beam L is removed. Therefore, even when the foreign substance 62 is attached onto the divisional cutting schedule line DL, the foreign substance 62 can be removed before the laser beam L is irradiated. Accordingly, the laser beam L can be properly irradiated. Further, an attachment substance generated from the semiconductor substrate 21 can be also removed by the irradiation of the laser beam L.

The adsorbing member 47 may be also arranged in a position separated from the laser head H without arranging the adsorbing member 47 adjacently to the laser head H.

Sixth Embodiment Mode

Figure 8:
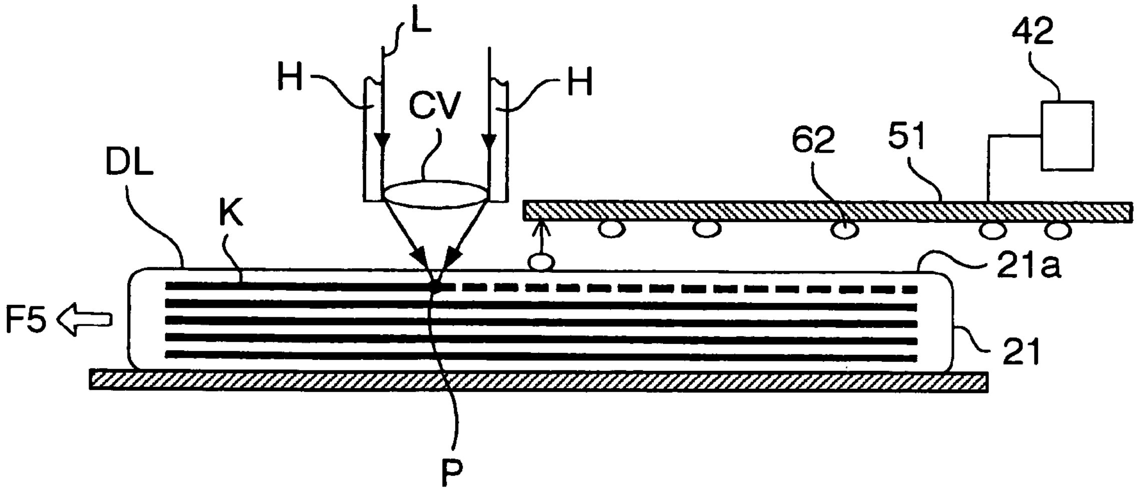
FIG. 8 is a cross sectional view explaining a method for forming a reforming area with using an adsorbing member in a case where a laser head is fixed and a semiconductor substrate is moved in a horizontal direction.

The laser head H may be fixed as shown in FIG. 8. When the semiconductor substrate 21 is moved in the horizontal direction (the direction of arrow F5 in this figure) and the reforming area K is formed, an adsorbing member 51 may be also arranged above the divisional cutting schedule line DL adjacently to a scanning direction side of the laser beam L seen from the laser head H.

When this construction is used, no laser beam L is irradiated on the divisional cutting schedule line DL below the adsorbing member 51. Therefore, even when a foreign substance 62 is attached onto the divisional cutting schedule line DL, the foreign substance 62 can be removed before the laser beam L is irradiated. Accordingly, the laser beam L can be properly irradiated.

When the dust 61 and foreign substance 62 are removed by the adsorbing member, the electric potential of polarity reverse to that of the electric potential applied to the adsorbing member may be also applied to the semiconductor substrate 21. When this construction is used, it is possible to weaken force for attaching the dust 61 and foreign substance 62 to the substrate face 21*a*. Accordingly, the dust 61 and foreign substance 62 can be efficiently removed from the substrate face 21*a*.

When the dust 61 and the foreign substance 62 are removed by the adsorbing member, a vibration may be also given to the semiconductor substrate 21 by using a vibrating means such as an ultrasonic oscillator, etc. When this construction is used, adhesive force of dust 61 and foreign substance 62 to the substrate face 21*a* can be weakened by the vibration of the semiconductor substrate 21. Accordingly, the dust 61 and the foreign substance 62 can be efficiently removed.

The semiconductor substrate constructed by only silicon is used in the semiconductor substrate 21, but it is not limited to this construction. For example, a construction may be such that an oxide film constructed by silicon oxide is formed on the substrate face 21*a* of the semiconductor substrate 21, and a wafer may be a SOI (Silicon On Insulator).

The divisional cutting device 1 corresponds to a divisional cutting means. Adsorbing members 41, 47, 49 and second adsorbing member 45 correspond to an adsorbing means. Electrostatic generators 42, 48 and second electrostatic generator 46 correspond to a static electricity generating means.

Attachment substance removing device 40 corresponds to an attachment substance removing means. Dust 61 and foreign substance 62 correspond to an attachment substance. Attachment substance collecting member 43 corresponds to a separating means.

Seventh Embodiment Mode

Figure 10A:
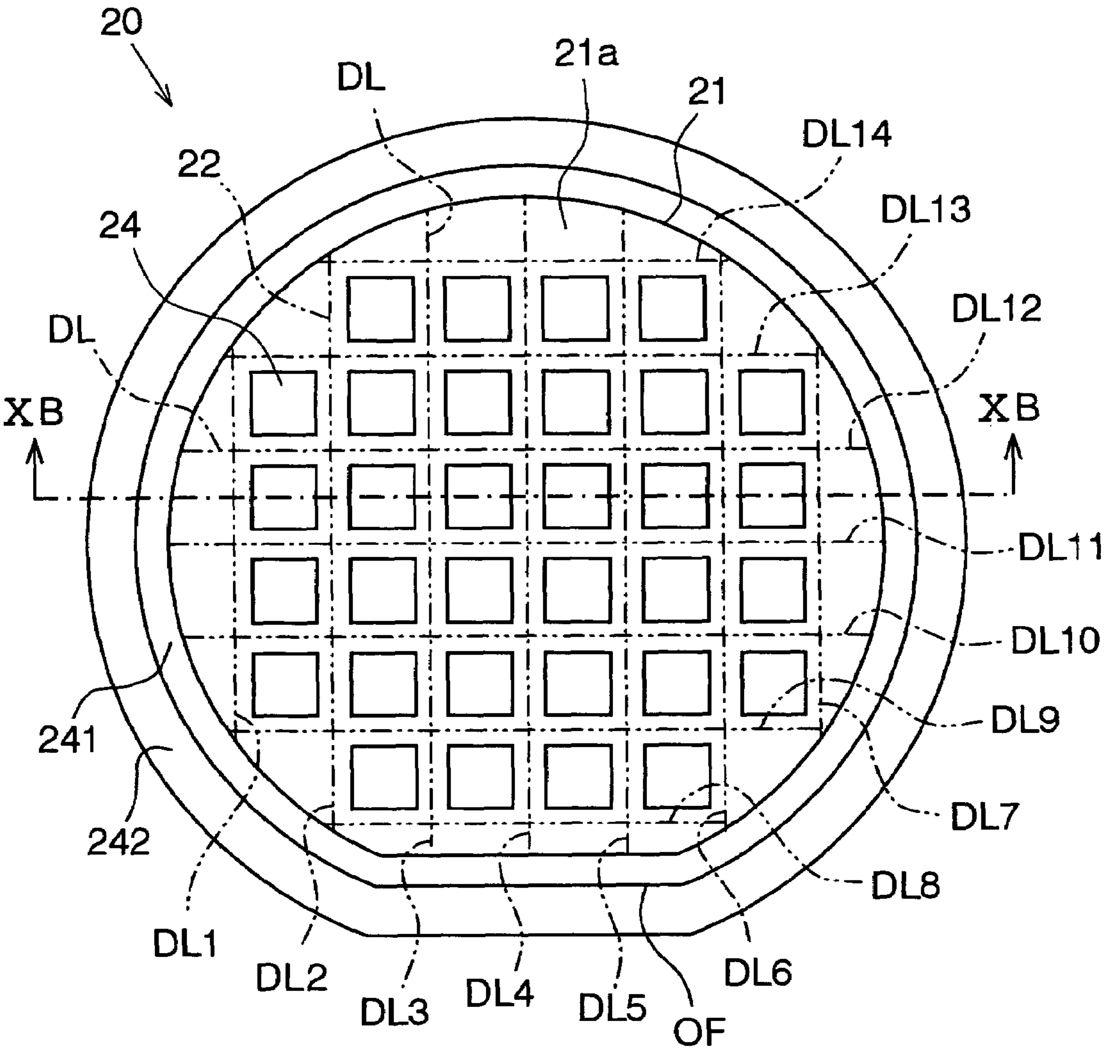
FIG. 10A is a plan view showing a semiconductor wafer.
Figure 10B:
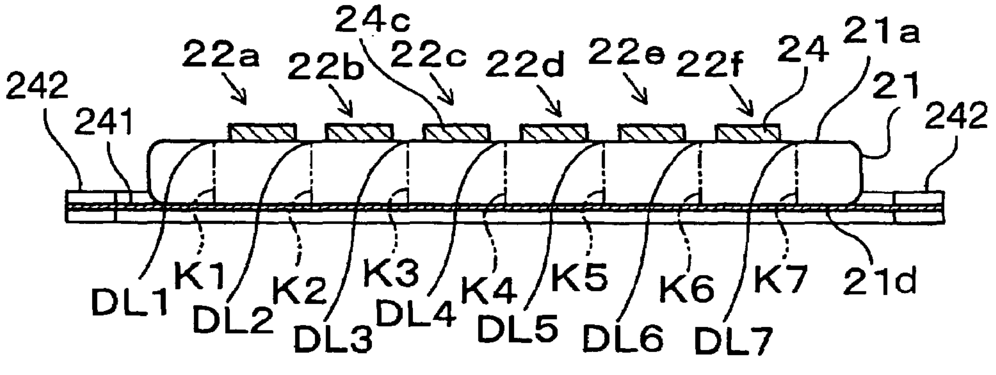
FIG. 10B is a cross sectional view showing the wafer taken along line XB-XB in FIG. 10A.
Figure 11:
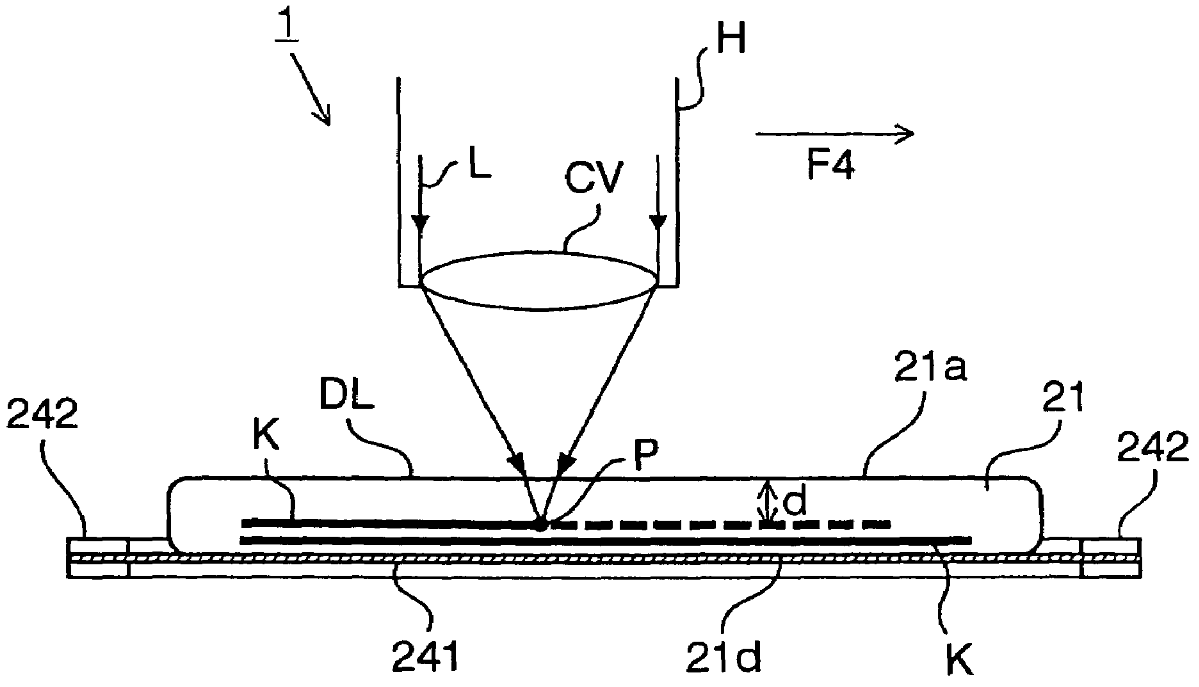
FIG. 11 is a cross sectional view showing a method for forming a reforming area by using a laser beam.
Figure 12A:
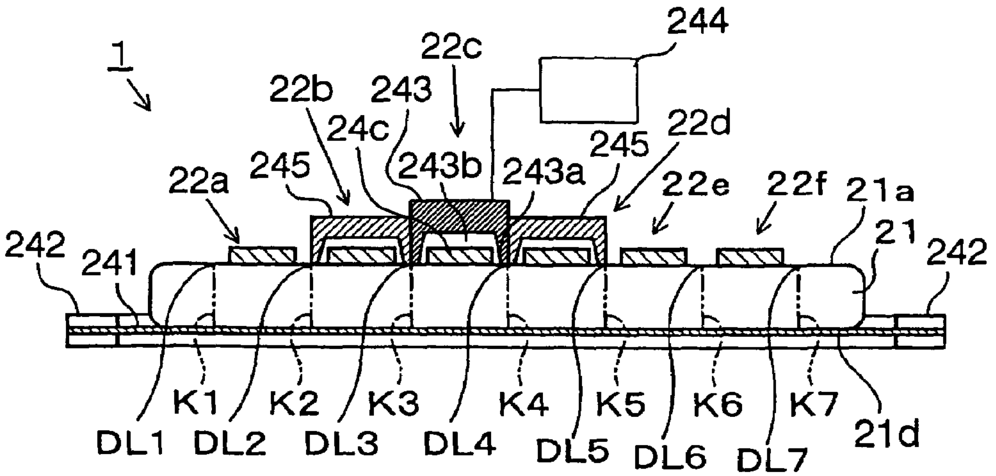
FIGS. 12A and 12B are cross sectional views explaining a method for separating a semiconductor wafer into multiple chips.
Figure 12B:
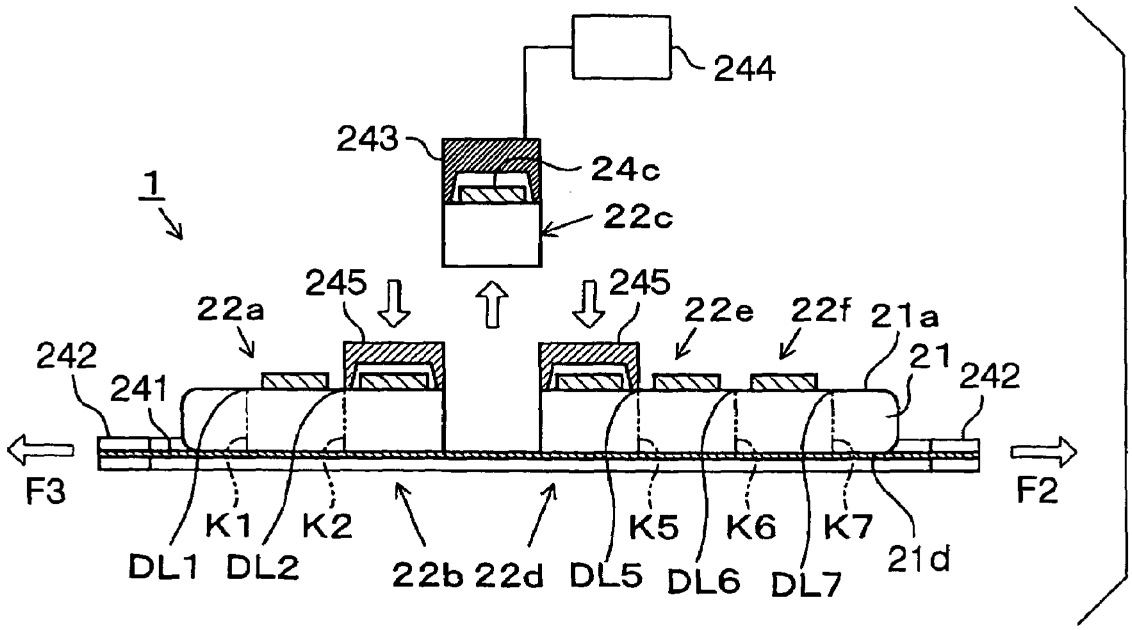

A seventh embodiment mode of a manufacturing device and a manufacturing method of a semiconductor chip will be explained with reference to the drawings. FIGS. 10A and 10B are typical views showing a constructional example of a semiconductor substrate divided by the manufacturing device of the semiconductor chip. FIG. 10A is a plan explanatory view of the semiconductor substrate adhered to a sheet held in a frame. FIG. 10B is a cross-sectional view of arrow XB-XB of FIG. 10A. FIG. 11 is an explanatory view of the manufacturing device of the semiconductor chip for irradiating a laser beam to the semiconductor substrate. FIGS. 12A and 12B are explanatory views of the manufacturing method of the semiconductor chip using the manufacturing device in accordance with the seventh embodiment mode. FIG. 12A is an explanatory view of a state before the semiconductor substrate is divided. FIG. 12B is an explanatory view of a state after the semiconductor substrate is divided.

In each of these figures, one portion is enlargedly and exaggeratedly shown for the explanation.

First, a wafer 20 is prepared as shown in FIG. 10A. A semiconductor substrate 21 of a thin disk shape constructed by silicon is arranged in the wafer 20. An orientation flat OF showing a crystal orientation is formed in one portion of the outer circumference of the semiconductor substrate 21. Plural semiconductor chips 22 each having a semiconductor element 24 formed via a diffusion process, etc. are line up and arranged as in checkers on a substrate face 21*a* of this semiconductor substrate 21. In the following explanation, a portion not divided from the semiconductor substrate 21 and originally set to the semiconductor chip after the division is also called a semiconductor chip. These semiconductor chips 22 are respectively divided in a thickness direction along a divisional schedule line, i.e., dicing line DL by a dicing process, and are then completed as IC and LSI packaged via respective processes of a mount process, a bonding process, an enclosing process, etc.

In the semiconductor substrate 21, the rear face 21*d* of the substrate face 21*a* is adhered to a sheet 241 manufactured by resin and having a drawing property. An outer circumferential portion of the sheet 241 is held by a frame 242 of an annular shape in a spreading state of the sheet 241.

Divisional schedule lines DL1 to DL14 as schedule lines for dividing the semiconductor substrate 21 in the thickness direction are set on the substrate face 21*a* between the respective semiconductor elements 24. Divisional schedule lines DL1 to DL7 are respectively set in parallel with a direction approximately perpendicular to the orientation flat OF. Divisional schedule lines DL8 to DL14 are respectively set in parallel with a direction approximately parallel to the orientation flat OF. Namely, four sides of the circumference of each semiconductor element 24 are surrounded by the divisional schedule line DL.

As shown in FIG. 10B, six semiconductor chips 22*a* to 22*f* are formed on line XB-XB. Seven divisional schedule lines DL1 to DL7 and divisional schedule lines DL11, DL12 (FIG. 10A) are set on the substrate face of the semiconductor substrate 21. Reforming areas K1 to K7 as a starting point of the division are formed by a method described later in the thickness direction corresponding to divisional schedule lines DL1 to DL7. Similarly, unillustrated reforming areas are formed in the thickness direction corresponding to divisional schedule lines DL11, DL12 (FIG. 10A).

As shown in FIG. 11, a laser head H for irradiating a laser beam L is arranged in the manufacturing device, i.e., divisional cutting device or dicing device 1 of the semiconductor chip. The laser head H has a condenser lens CV for converging the laser beam L, and can converge the laser beam L at a predetermined focal distance. Here, a convergent point P of the laser beam L is set so as to be formed in a position of depth d from the substrate face 21*a* of the semiconductor substrate 21.

To form the reforming area K within the semiconductor substrate 21, one of the divisional schedule lines DL shown in FIG. 10A is first scanned by the laser beam for detecting the semiconductor substrate, and an outer circumferential end portion 21*c* shown in FIG. 10B is detected and an irradiating range of the laser beam L is set.

Subsequently, as shown in FIG. 11, the laser head H is scanned along the divisional schedule line DL (the direction of arrow F4 in this figure), and the laser beam L is irradiated from the substrate face 21*a*. Thus, the reforming area K using multiphoton absorption is properly formed in a path of depth d in which the convergent point P of the laser beam L is scanned. The reforming area K of an arbitrary layer number can be formed at an arbitrary depth within a thickness range of the semiconductor substrate 21 by adjusting the depth d of the convergent point P of the laser beam L. For example, when the thickness is comparatively thick, the semiconductor substrate 21 can be easily divided by moving the convergent point P in its thickness direction and forming the reforming area K in a continuous shape in the thickness direction, or forming the reforming area K in plural portions.

Here, the multiphoton absorption is that a substance absorbs plural photons of the same kind or different kinds. A phenomenon called optical damage is generated by this multiphoton absorption at the convergent point P of the semiconductor substrate W and its vicinity. Thus, thermal strain is induced, and a crack is generated in its portion. A layer constructed by gathering these cracks, i.e., the reforming area K is formed.

Subsequently, the crack is developed in the thickness direction of the substrate with the reforming area K as a starting point by loading stress to the semiconductor substrate 21, and the semiconductor substrate 21 is divided in the thickness direction along the divisional schedule line DL. Here, as shown in FIG. 10B, a dividing process for dividing semiconductor chip 22*c* among six semiconductor chips 22*a* to 22*f* arranged on line XB-XB will be explained.

As shown in FIG. 12A, in the semiconductor substrate 21, reforming areas K1 to K7 corresponding to divisional schedule lines DL1 to DL7 and unillustrated reforming areas corresponding to divisional schedule lines DL11, DL12 (FIG. 10A) are introduced, and the semiconductor substrate 21 is adhered to the sheet 241. Here, the frame 242 for holding the sheet 241 is fixed so as not to be moved by an unillustrated fixing means.

An holding member 243 (e.g., die pickup or chip adsorbing member) for adsorbing and holding the semiconductor chip 22*c*, an unillustrated adsorbing device for adsorbing the holding member 243 to the semiconductor chip 22*c*, and a moving mechanism 244 for moving the holding member 243 are arranged in the manufacturing device 1 of the semiconductor chip. An abutting portion 243*a* is formed in a tip portion of the holding member 243. The abutting portion 243*a* abuts on a portion surrounded by the circumference of the semiconductor element 24*c*, divisional schedule lines DL3, DL4 and divisional schedule lines DL11, DL12 (FIG. 10A) on the substrate face 21*a*. In a state in which the holding member 243 and the substrate face 21*a* abut, the holding member 243 adsorbs the substrate face 21*a* by reducing the pressure of the interior of a space 243*b* between the holding member 243 and the substrate face 21*a* by an unillustrated sucking device. Here, when the abutting portion 243*a* is formed by an elastic body such as rubber, etc., a close attaching property to the substrate face 21*a* is improved and adsorption force is increased.

A biasing member 245 is abutted and arranged on the substrate face 21*a* of semiconductor chips adjacent to the semiconductor chip 22*c* and including semiconductor chips 22*b*, 22*d*. The biasing member 245 is a plate-shaped member having an abutting portion abutting on the substrate face 21*a*. The biasing member 245 biases semiconductor chips 22*b*, 22*d* downward by pressing the substrate face 21*a* by the abutting portion. Here, a construction having a direct-acting mechanism using a motor, etc. and able to be raised and lowered may be also used in the biasing member 245.

Next, as shown in FIG. 12B, the holding member 243 is raised by the moving mechanism 244. Semiconductor chips 22*b*, 22*d* adjacent to the semiconductor chip 22*c* are biased from a direction reverse to a moving direction of the semiconductor chip 22*c* by the biasing member 245, and deformation of a portion except for the semiconductor chip 22*c* of the semiconductor substrate 21 is restrained. Therefore, shearing stress is concentratedly generated in reforming areas K3, K4 and reforming areas corresponding to divisional schedule lines DL11, DL12 (FIG. 10A). Thus, the semiconductor substrate 21 is divided in the thickness direction along divisional schedule lines DL3, DL4 and divisional schedule lines DL11, DL12 set in the circumference of the semiconductor element 24*c* so that the semiconductor chip 22*c* is obtained. The semiconductor chip 22*c* is detached from the sheet 241 by further raising the holding member 243, and is pulled upward.

Air is blown to the semiconductor chip 22*c* by using an unillustrated air cleaner in a state in which the pulled-up semiconductor chip 22*c* is adsorbed by the holding member 243. Thus, dust, etc. generated at a dividing time are removed. Subsequently, it is transferred to a mounting process for mounting the holding member 243 to a package by the moving mechanism 244 in the adsorbing state of the semiconductor chip 22*c*.

The other semiconductor chips 22*a*, 22*b*, 22*d* to 22*f* can be also individually divided by performing similar operations.

The above device has the following effect.

(1) The holding member 243 is adsorbed to a portion surrounded by the circumference of the semiconductor element 24*c* of the substrate face 21*a*, divisional schedule lines DL3, DL4 and divisional schedule lines DL11, DL12, and force operated upward is then applied. Thus, stress can be reliably loaded to reforming areas K3, K4 formed correspondingly to divisional schedule lines DL3, DL4, and reforming areas formed correspondingly to divisional schedule lines DL11, DL12. Therefore, the semiconductor chip 22*a* attaching the holding member 243 thereto can be reliably divided in the thickness direction along divisional schedule lines DL3, DL4, DL11, DL12, and crack leaving is removed. Accordingly, it is possible to realize the manufacturing device 1 and the manufacturing method of the semiconductor chip able to improve yield of the semiconductor chip 22 obtained by dividing the semiconductor substrate 21.

(2) The biasing member 245 for biasing the semiconductor chips 22*b*, 22*d* adjacent to the semiconductor chip 22*c* attaching the holding member 243 thereto in the direction reverse to that of force applied by the holding member 243 is arranged. Therefore, when stress is loaded by the holding member 243, deformation of the semiconductor substrate 21 except for an attaching portion of the holding member 243 is restrained. Further, stress can be concentratedly loaded to the reforming areas K3, K4 and the reforming areas formed correspondingly to the divisional schedule lines DL11, DL12. Accordingly, only the semiconductor chip 22*c* can be reliably divided.

(3) The holding member 243 is transferred to the mounting process of the semiconductor chip 22*c* in the adsorbing state of the divided semiconductor chip 22*c*. Therefore, in comparison with a method for picking-up and transferring the semiconductor chip 22*c* to the mounting process after the semiconductor chip 22*c* is divided, time can be shortened and the semiconductor chip 22*c* can be reliably transferred to the mounting process without failing in the pickup of the semiconductor chip 22*c*.

(4) The semiconductor substrate 21 can be diced by applying a laser dicing method after the semiconductor substrate 21 is adhered to the sheet 241. Therefore, the dicing process can be shortened, and no dust is generated at a dicing time. Therefore, there is no fear that dust is attached to the substrate face 21*a* of the semiconductor substrate 21.

Figure 16A:
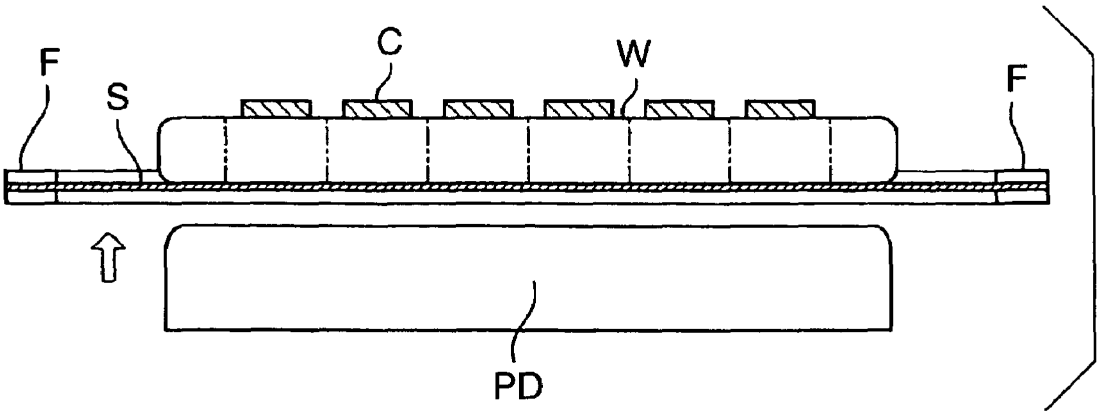
Figure 16B:
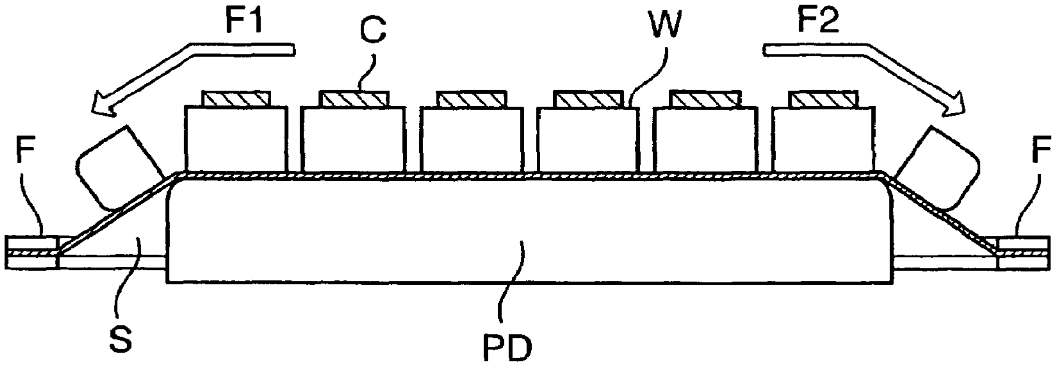

Modifications of Seventh Embodiment Mode (1) When stress is loaded to the semiconductor substrate 21 and the sheet 241 is extended in a planar direction (the directions of arrows F3 and F2 in FIG. 12B), tensile stress is loaded to the semiconductor substrate 21 in the planar direction. Therefore, since stress applied to reforming areas K3, K4 and reforming areas formed correspondingly to divisional schedule lines DL11, DL12 is increased, the division can be further easily performed. As a method for extending the sheet 241, for example, it is possible to adopt a method using a pressing device PD as shown in FIGS. 16A and 16B.

(2) In this embodiment mode, the laser dicing method for irradiating the laser beam L from the substrate face 21*a* and forming the reforming area K within the semiconductor substrate 21 is illustrated as a dicing method of the semiconductor substrate 21. However, another method other than the laser dicing method may be used. For example, a dicing method for forming a notch in the semiconductor substrate 21 by a diamond blade can be applied to the manufacturing device 1 of the semiconductor chip of this embodiment mode. Further, a dicing method for performing laser dicing can be applied after the notch is formed in the semiconductor substrate 21 by the diamond blade.

The semiconductor substrate 21 is held by adhering this semiconductor substrate 21 by the sheet 241, but may be also held by another method. For example, the semiconductor substrate 21 may be also held by nipping an outer circumferential portion of the semiconductor substrate 21 by a fixing jig arranged in a pedestal.

(3) In this embodiment mode, the construction for dividing only the semiconductor chip 22*c* is illustrated as an example. Alternatively, semiconductor chips 22*c*, 22*d*, 22*e* can be also divided by one operation by further arranging the holding member 243 in the semiconductor chip 22*e* and the biasing member 245 in the semiconductor chip 22*f*.

Namely, plural semiconductor chips can be also obtained by one operation by alternately arranging the adsorbing member and a fixing member in the adjacent semiconductor chips 22 and loading stress.

Eighth Embodiment Mode

Figure 13A:
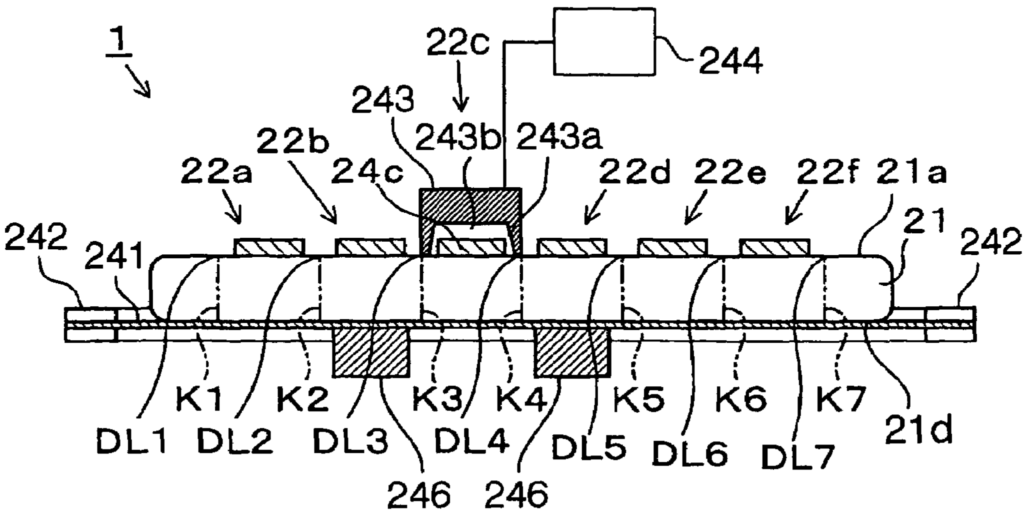
FIGS. 13A and 13B are cross sectional views explaining another method for separating a semiconductor wafer into multiple chips.
Figure 13B:
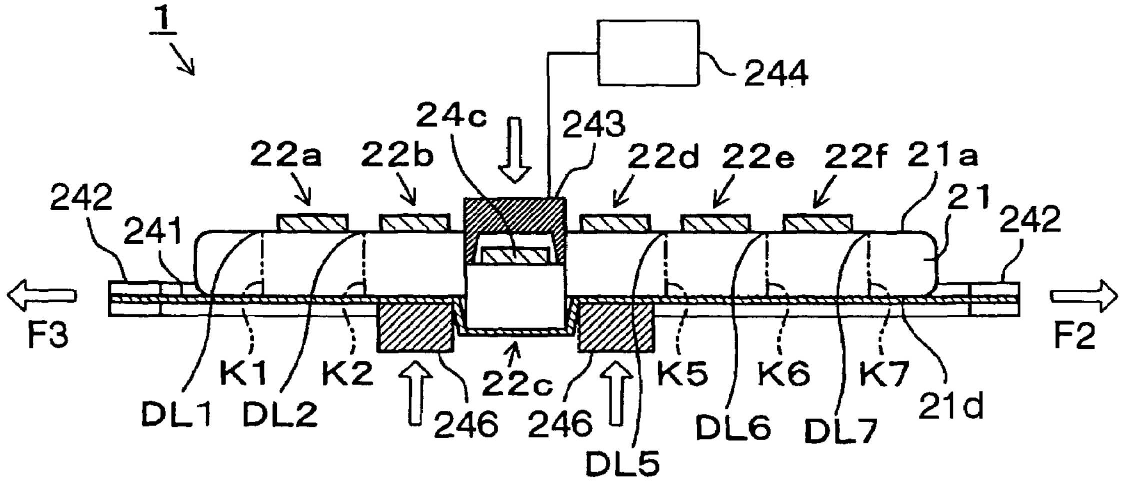

An eighth embodiment mode of the manufacturing device and the manufacturing method of the semiconductor chip will be explained with reference to the drawings. FIGS. 13A and 13B are explanatory views of a manufacturing method of the semiconductor chip using the manufacturing device in accordance with the eighth embodiment mode. FIG. 13A is an explanatory view of a state before the division of the semiconductor substrate. FIG. 13B is an explanatory view of a state after the division of the semiconductor substrate.

As shown in FIG. 13A, in a semiconductor substrate 21, reforming areas K1 to K7 corresponding to divisional schedule lines DL1 to DL7 and unillustrated reforming areas corresponding to divisional schedule lines DL11, DL12 (FIG. 10A) are introduced, and the semiconductor substrate 21 is adhered to a sheet 241. Here, a frame 242 for holding the sheet 241 is fixed so as not to be moved by an unillustrated fixing means.

Next, a biasing member 246 for biasing semiconductor chips 22*b*, 22*d* upward is abutted through the sheet 241 from the rear face 21*d* of the semiconductor substrate 21 in which semiconductor chips 22*b*, 22*d* adjacent to semiconductor chip 22*c* are formed.

As shown in FIG. 13B, when an holding member 243 is lowered by a moving mechanism 244, the semiconductor chip 22*c* is pushed-in downward while the semiconductor chip 22*c* is adhered to the sheet 241 in a state in which the semiconductor chips 22*b*, 22*d* are biased upward by the biasing member 246. Thus, shearing stress is concentratedly generated in reforming areas K3, K4 and reforming areas corresponding to divisional schedule lines DL11, DL12 (FIG. 10A). Therefore, the semiconductor substrate 21 is divided in the thickness direction along divisional schedule lines DL3, DL4 and divisional schedule lines DL11, DL12 set in the circumference of a semiconductor element 24*c* so that the semiconductor chip 22*c* is obtained.

When the holding member 243 is raised, the semiconductor chip 22*c* is detached from the sheet 241 and is pulled upward. Air is then blown to the semiconductor chip 22*c* by using an unillustrated air cleaner in a state in which the pulled-up semiconductor chip 22*c* is adsorbed by the holding member 243. Thus, dust, etc. generated at a dividing time are removed. Subsequently, in the adsorbing state of the semiconductor chip 22*c*, the semiconductor chip 22*c* is transferred to a mounting process for mounting the holding member 243 to a package by the moving mechanism 244.

The other semiconductor chips 22*a*, 22*b*, 22*d* to 22*f* can be also individually divided by performing similar operations.

The above device has the following effect.

(1) Stress can be reliably loaded to reforming areas K3, K4 and reforming areas formed correspondingly to divisional schedule lines DL11, DL12 by the holding member 243. Therefore, the semiconductor chip 22*a* can be reliably divided in the thickness direction along divisional schedule lines DL3, DL4, DL11, DL12, and no crack leaving is removed. Accordingly, it is possible to realize the manufacturing device 1 and the manufacturing method of the semiconductor chip able to improve yield of the semiconductor chip 22 obtained by dividing the semiconductor substrate 21.

(2) The biasing member 245 for biasing the semiconductor chips 22*b*, 22*d* adjacent to the semiconductor chip 22*c* attaching the holding member 243 thereto in the direction reverse to that of force applied by the holding member 243 is arranged. Therefore, when stress is loaded by the holding member 243, deformation of the semiconductor substrate 21 except for an attaching portion of the holding member 243 is restrained, and stress can be concentratedly loaded to reforming areas K3, K4 and reforming areas formed correspondingly to divisional schedule lines DL11, DL12. Accordingly, only the semiconductor chip 22*c* can be reliably divided.

(3) The holding member 243 transfers the divided semiconductor chip 22*c* to the mounting process of the semiconductor chip 22*c* in an adsorbing state. Therefore, in comparison with a method for picking-up and transferring the semiconductor chip 22*c* to the mounting process after the semiconductor chip 22*c* is divided, time can be shortened and the semiconductor chip 22*c* can be reliably transferred to the mounting process without failing in the pickup of the semiconductor chip 22*c*.

(4) Force for attaching the holding member 243 to the semiconductor chip 22*c* may be set to force of a degree not shifted from a loading direction of stress at a pressing time. Accordingly, force required in attachment can be reduced.

Modifications of Eighth Embodiment Mode (1) When stress is loaded to the semiconductor substrate 21 and the sheet 241 is extended in the planar direction (the directions of arrows F3, F2 in FIG. 13B), tensile stress is loaded to the semiconductor substrate 21 in the planar direction. Therefore, since stress applied to reforming areas K3, K4 and reforming areas formed correspondingly to divisional schedule lines DL11, DL12 is increased, the division can be further easily performed. As a method for extending the sheet 241, for example, it is possible to adopt a method using the pressing device PD as shown in FIGS. 16A and 16B.

(2) In this embodiment mode, the construction for dividing only the semiconductor chip 22*c* is illustrated as an example. Alternatively, semiconductor chips 22*c*, 22*d*, 22*e* can be also divided by one operation by further arranging the holding member 243 in the semiconductor chip 22*e* and the biasing member 246 in the semiconductor chip 22*f*. Further, in this embodiment mode, the semiconductor chip 22*c* is moved downward by using the holding member 243. However, a construction for pushing-in the semiconductor chip 22*c* by using a pressing member having only a moving mechanism, and using the holding member 243 at only a transfer time to the mounting process may be also used.

Ninth Embodiment Mode

Figure 14A:
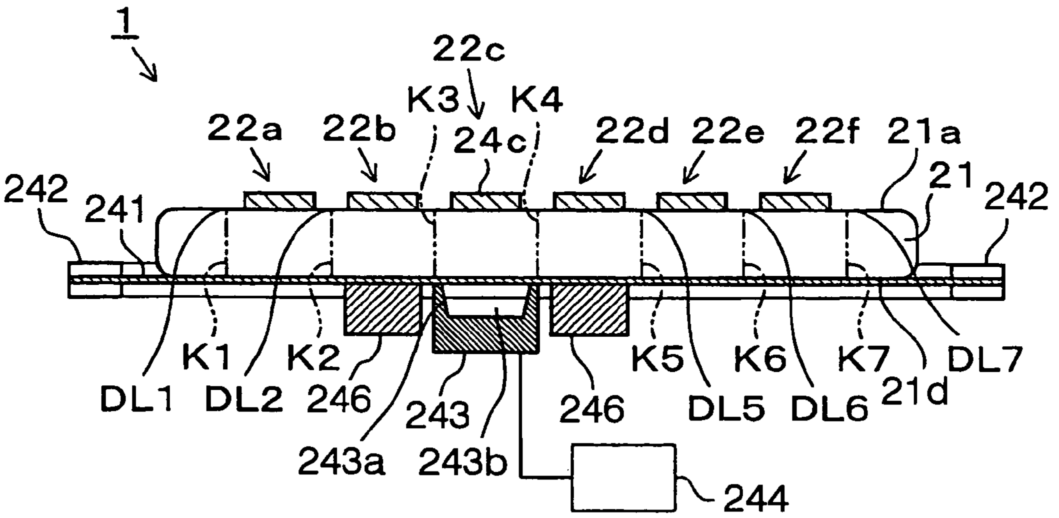
FIGS. 14A and 14B are cross sectional views explaining further another method for separating a semiconductor wafer into multiple chips.
Figure 14B:
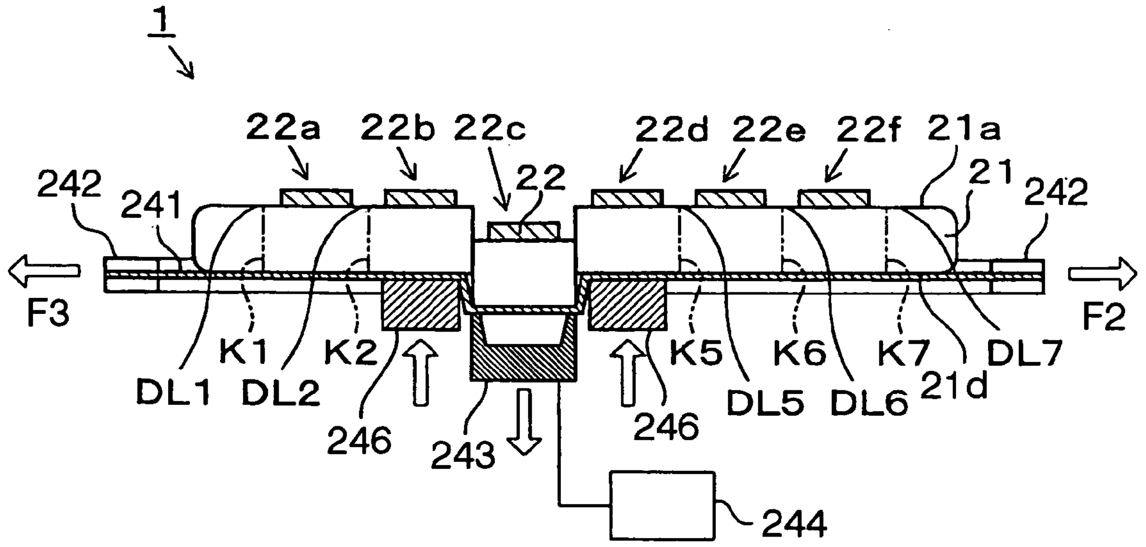

A ninth embodiment mode of the manufacturing device and the manufacturing method of the semiconductor chip will be explained with reference to the drawings. FIGS. 14A and 14B are explanatory views of the manufacturing method of the semiconductor chip using the manufacturing device. FIG. 14A is an explanatory view of a state before the division of the semiconductor substrate. FIG. 14B is an explanatory view of a state after the division of the semiconductor substrate.

As shown in FIG. 14A, in this embodiment mode, a holding member 243 is arranged on the rear face 21*d* side of the semiconductor chip 22*c*, and adsorbs the semiconductor chip 22*c* through a sheet 241.

Next, a biasing member 246 for biasing semiconductor chips 22*b*, 22*d* upward is abutted through the sheet 241 from the rear faces 21*b* of the semiconductor chips 22*b*, 22*d*.

As shown in FIG. 14B, when the holding member 243 is lowered by a moving mechanism 244 in a state in which the semiconductor chips 22*b*, 22*d* are biased upward by the biasing member 246, the semiconductor chip 22*c* is pulled-in downward while the semiconductor chip 22*c* is adhered to the sheet 241. Thus, shearing stress is concentratedly generated in reforming areas K3, K4 and reforming areas corresponding to divisional schedule lines DL11, DL12 (FIG. 10A). Therefore, the semiconductor substrate 21 is divided in the thickness direction along divisional schedule lines DL3, DL4 and divisional schedule lines DL11, DL12 set in the circumference of the semiconductor element 24*c* so that the semiconductor chip 22*c* is obtained.

Here, when the holding member 243 is also arranged above the semiconductor substrate 21 and the divided semiconductor chip 22*c* is adsorbed and the holding member 243 is raised by the moving mechanism 244, the semiconductor chip 22*c* is detached from the sheet 241, and is pulled upward. In a state in which the pulled-up semiconductor chip 22*c* is adsorbed by the holding member 243, air is blown to the semiconductor chip 22*c* by using an unillustrated air cleaner so that dust, etc. generated at a dividing time are removed. Subsequently, in the adsorbing state of the semiconductor chip 22*c*, it is transferred to a mounting process for mounting the holding member 243 to a package by the moving mechanism 244.

Other semiconductor chips 22*a*, 22*b*, 22*d* to 22*f* can be also individually divided by performing similar operations.

The above device has the following effect.

(1) Stress can be reliably loaded to reforming areas K3, K4 and reforming areas formed correspondingly to divisional schedule lines DL11, DL12 by the holding member 243. Therefore, the semiconductor chip 22*a* can be reliably divided in the thickness direction along divisional schedule lines DL3, DL4, DL11, DL12, and crack leaving is removed. Accordingly, it is possible to realize the manufacturing device 1 and the manufacturing method of the semiconductor chip able to improve yield of the semiconductor chip 22 obtained by dividing the semiconductor substrate 21.

(2) The biasing member 246 for biasing the semiconductor chips 22*b*, 22*d* adjacent to the semiconductor chip 22*c* attaching the holding member 243 thereto in the direction reverse to that of force applied by the holding member 243 is arranged. Therefore, when stress is loaded by the holding member 243, deformation of the semiconductor substrate 21 except for an attaching portion of the holding member 243 is restrained, and stress can be concentratedly loaded to reforming areas K3, K4 and reforming areas formed correspondingly to divisional schedule lines DL11, DL12. Accordingly, only the semiconductor chip 22*c* can be reliably divided.

(3) Since the holding member 243 is attached to the rear face 21*d* forming no semiconductor element 24 thereon through the sheet 241, there is no fear of damage of the semiconductor element 24.

Modifications of Ninth Embodiment Mode (1) When stress is loaded to the semiconductor substrate 21 and the sheet 241 is extended in a planar direction (the directions of F3 and F2 in FIG. 14B), tensile stress is loaded to the semiconductor substrate 21 in the planar direction. Therefore, since stress applied to reforming areas K3, K4 and reforming areas formed correspondingly to divisional schedule lines DL11, DL12 is increased, the division can be further easily performed. As a method for extending the sheet 241, for example, it is possible to adopt a method using the pressing device PD as shown in FIGS. 16A and 16B.

(2) In this embodiment mode, the construction for dividing only the semiconductor chip 22*c* is illustrated as an example. Alternatively, semiconductor chips 22*c*, 22*d*, 22*e* can be also divided by one operation by further arranging an holding member 243 in the semiconductor chip 22*e* and a biasing member 246 in the semiconductor chip 22*f*.

Tenth Embodiment Mode

Figure 15A:
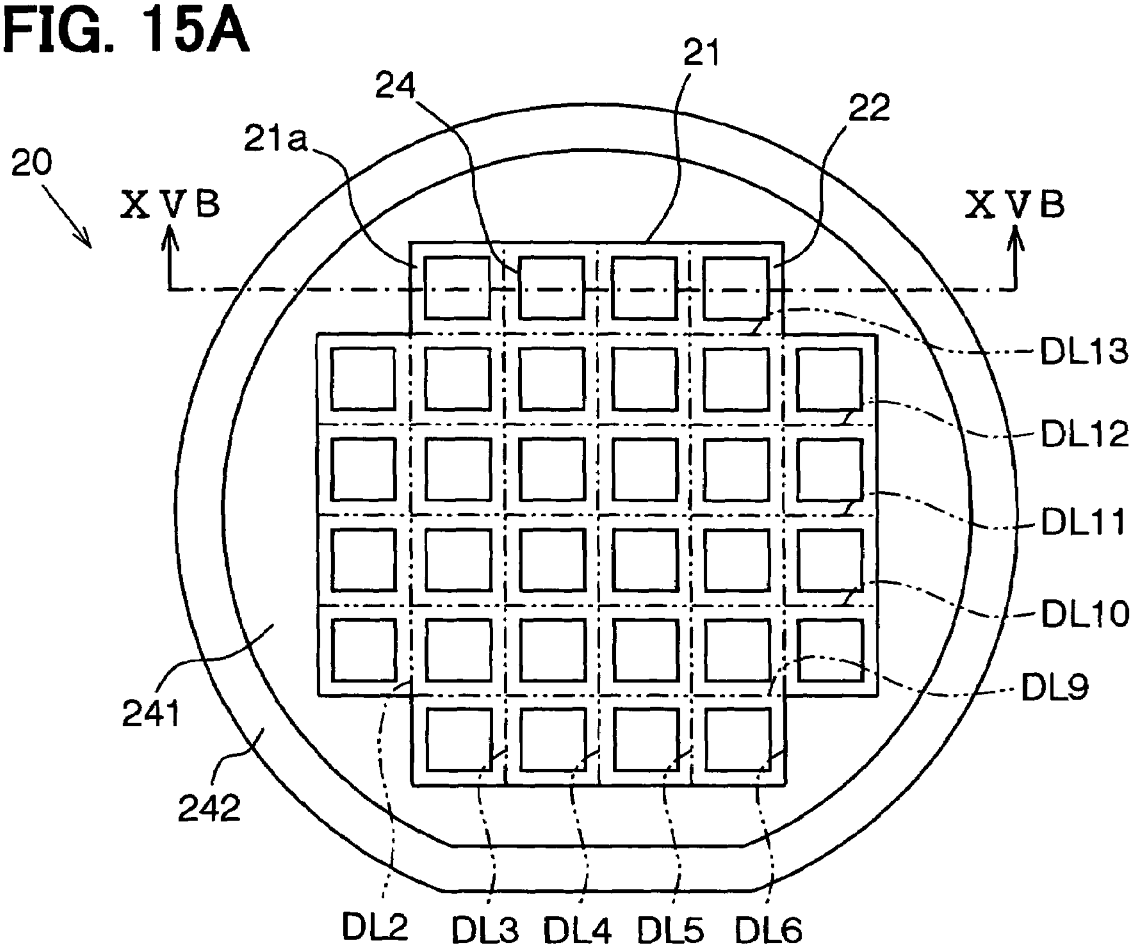
FIG. 15A to 15C are cross sectional views explaining another method for separating a semiconductor wafer into multiple chips.
Figure 15B:
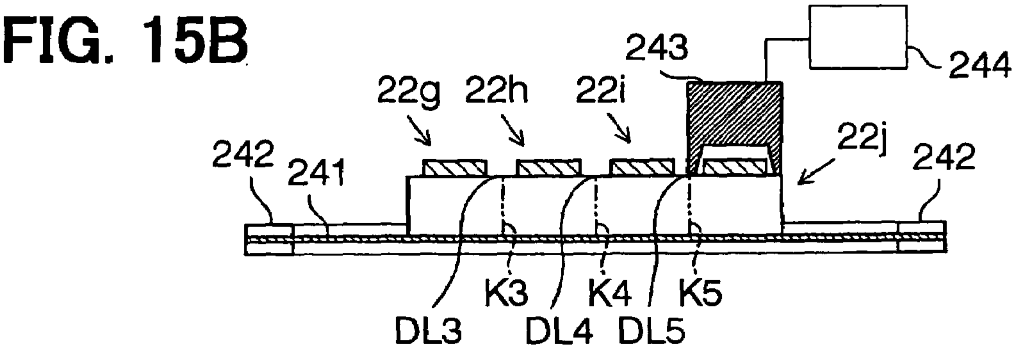
Figure 15C:
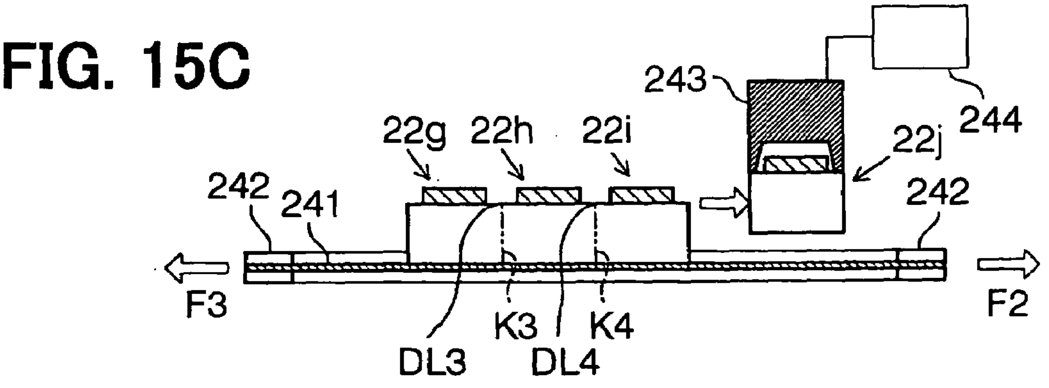

A tenth embodiment mode of the manufacturing device and the manufacturing method of the semiconductor chip will be explained with reference to the drawings. FIGS. 15A to 15C are explanatory views of the manufacturing method of the semiconductor chip using the manufacturing device in accordance with the tenth embodiment mode. FIG. 15A is a plan explanatory view of the semiconductor substrate from which a portion of the semiconductor chip adhered to a sheet held in a frame is removed. FIG. 15B is an explanatory view of a state before the division of the semiconductor substrate. FIG. 15C is an explanatory view of a state after the division of the semiconductor substrate.

First, the semiconductor substrate 21 removing a portion except for the semiconductor chip 22 is prepared as shown in FIG. 15A. Here, a process for dividing a semiconductor chip 22*j* formed in a right-hand end portion in this figure among four semiconductor chips 22*g* to 22*j* arranged on line XVB-XVB will be explained.

As shown in FIG. 15B, in the semiconductor substrate 21, reforming areas K3 to K5 corresponding to divisional schedule lines DL3 to DL5 and an unillustrated reforming area corresponding to divisional schedule line DL13 (FIG. 15A) are introduced, and the semiconductor substrate 21 is adhered to a sheet 241. Here, a frame 242 for holding the sheet 241 is fixed so as not to be moved by an unillustrated fixing means. The semiconductor chip 22*j* is adsorbed by a holding member 243 on the substrate face 21*a* around a semiconductor element 24.

Subsequently, as shown in FIG. 15C, stress is generated in the reforming area K5 and the unillustrated reforming area corresponding to the divisional schedule line DL13 (FIG. 10A) by moving the holding member 243 toward the outside approximately in parallel with the planar direction of the semiconductor substrate 21 by a moving mechanism 244. Thus, the semiconductor substrate 21 is divided in the thickness direction along divisional schedule lines DL5 and DL13 set in the circumference of the semiconductor element 24*c* so that the semiconductor chip 22*j* is obtained. The semiconductor chip 22*j* is then detached from the sheet 241 by moving the holding member 243 by the moving mechanism 244.

Dust, etc. generated at a dividing time are removed from the semiconductor chip 22*c* detached from the sheet 241 by blowing air to the semiconductor chip 22*j* by using an unillustrated air cleaner in a state in which the semiconductor chip 22*c* is adsorbed by the holding member 243. Subsequently, in the adsorbing state of the semiconductor chip 22*j*, it is transferred to a mounting process for mounting the holding member 243 to a package by the moving mechanism 244.

Other semiconductor chips 22*g* to 22*i* can be also individually divided by performing similar operations.

The above device has the following effect.

(1) Stress can be reliably loaded to the reforming area K5 and the reforming area formed correspondingly to the divisional schedule line DL13 by the holding member 243. Therefore, the semiconductor chip 22*a* can be reliably divided in the thickness direction along divisional schedule lines DL5, DL13, and crack leaving is removed. Accordingly, it is possible to realize the manufacturing device 1 and the manufacturing method of the semiconductor chip able to improve yield of the semiconductor chip 22 obtained by dividing the semiconductor substrate 21.

(2) The holding member 243 is transferred to the mounting process of the semiconductor chip 22*j* in a state in which the divided semiconductor chip 22*j* is adsorbed. Therefore, in comparison with a method for picking-up and transferring the semiconductor chip 22*j* to the mounting process after the semiconductor chip 22*j* is divided, time can be shortened and the semiconductor chip 22*c* can be reliably transferred to the mounting process without failing in the pickup of the semiconductor chip 22*c*.

(3) When the semiconductor chip 22*j* is divided, the semiconductor chip 22*j* is relatively moved in a direction separated from the semiconductor substrate 21 in the planar direction of the semiconductor substrate 21. Therefore, since no divided faces are rubbed, there is no fear of generation of chipping in the semiconductor chip 22*j*.

Modifications of Tenth Embodiment Mode (1) When stress is loaded to the semiconductor substrate 21 and the sheet 241 is extended in the planar direction (the directions of arrows F3, F2 in FIG. 15C), tensile stress is loaded in the planar direction in the semiconductor substrate 21. Therefore, stress applied to the reforming area K5 and the reforming area formed correspondingly to the divisional schedule line DL13 is increased so that the division can be further easily performed. As a method for extending the sheet 241, for example, it is possible to adopt a method using the pressing device PD as shown in FIGS. 16A and 16B.

Modifications of Seventh to Tenth Embodiment Modes (1) In each of the above embodiment modes, the construction for adsorbing the semiconductor chip 22 by using the holding member 243 is adopted. However, the semiconductor chip 22 may be also fixed to a member having the moving mechanism 244 by using another method, e.g., a method of adhesion, welding, etc.

(2) Some semiconductor chips may be also used as dummy chips for dividing the other semiconductor chips. For example, one side of each of adjacent semiconductor chips 22*b*, 22*d* can be divided by setting the semiconductor chip 22*c* shown in FIGS. 12A and 12B as a dummy chip and divisionally cutting the semiconductor chip 22*c* from the semiconductor substrate 21. The dummy chip may be set in advance, and a semiconductor chip, etc. recognized as a defective chip in an inspection may be also set as the dummy chip.

(3) When stress is loaded to the reforming area K by the holding member 243, a vibration may be also given to the semiconductor substrate 21 by using a vibrating means such as an ultrasonic vibrator, etc. When this construction is used, a crack can be developed from the reforming area K by a physical action of the vibration, and force required in the divisional cutting can be reduced. Accordingly, the semiconductor substrate 21 can be easily divisionally cut and yield of the semiconductor chip 22 can be improved.

(4) When stress is loaded to the reforming area K by the holding member 243, the semiconductor substrate 21 may be also heated by using a heating means such as a heater, etc. When this construction is used, thermal stress can be loaded to the reforming area K, and force required in the divisional cutting can be reduced. Accordingly, the semiconductor substrate 21 can be easily divisionally cut and yield of the semiconductor chip 22 can be improved.

(5) The semiconductor substrate constructed by only silicon is used in the semiconductor substrate 21. Alternatively, a construction in which an oxide film constructed by silicon oxide is formed on the substrate face 21*a* of the semiconductor substrate 21 may be used, and a wafer may be a SOI (Silicon On Insulator).

Eleventh Embodiment Mode

An eleventh embodiment mode of a divisional cutting device and a divisional cutting method of a semiconductor substrate will be explained with reference to the drawings. FIGS. 17A and 17B are typical views showing a constructional example of the semiconductor substrate divisionally cut by the divisional cutting device of the semiconductor substrate. FIG. 17A is a plan explanatory view of the surface of a wafer. FIG. 17B is a cross-sectional view of arrow XVIIB-XVIIB of FIG. 17A. FIG. 18 is an explanatory view of the divisional cutting device for irradiating a laser beam to the semiconductor substrate. FIGS. 19A and 19B are explanatory views of a pressing device in accordance with the eleventh embodiment mode. FIG. 19A is an explanatory view in which the pressing device is seen from above. FIG. 19B is a cross-sectional view of arrow XIXB-XIXB of FIG. 19A. FIGS. 20A and 20B are explanatory views of the divisional cutting method of the semiconductor substrate using the pressing device in accordance with the eleventh embodiment mode. FIG. 20A is an explanatory view of a state before the divisional cutting of the semiconductor substrate. FIG. 20B is an explanatory view of a state after the divisional cutting of the semiconductor substrate.

In each of these figures, one portion is enlargedly and exaggeratedly shown for the explanation.

Here, as shown in FIG. 17B, a divisional cutting process for divisionally cutting six semiconductor chips 22*a* to 22*f* arranged on line XVIIB-XVIIB will be explained.

As shown in FIG. 20A, a pressing device 343 for pressing the rear face of a sheet 241 and divisionally cutting a semiconductor substrate 21 is arranged in a divisional cutting device 1 of the semiconductor substrate 21.

As shown in FIG. 19A, a pressing projection 344 of a triangular shape in longitudinal section is arranged in an upper portion of the pressing device 343 on a face abutting on the rear face of the sheet 241 in a position corresponding to a divisional cutting schedule line DL of the semiconductor substrate 21. For example, as shown in FIG. 19B, pressing projections 344*a* to 344*g* are arranged in seven positions correspondingly to divisional cutting schedule lines DL1 to DL7 on line 1C-1C corresponding to line XVIIB-XVIIB of FIG. 17A.

First, as shown in FIG. 20A, the semiconductor substrate 21 introducing a reforming area K (FIG. 18) thereinto is conveyed above the pressing device 343 in a state adhered to the sheet 241, and a frame 242 is fixed by an unillustrated fixing means.

Next, as shown in FIG. 20B, when the pressing device 343 is raised by an unillustrated raising-lowering means, the pressing projections 344*a* to 344*g* abut on the rear face side of the semiconductor substrate 21 through the sheet. At this time, the pressing projection 344*a* abuts on a lower portion of the divisional cutting schedule line DL1. Similarly, pressing projections 344*b* to 344*g* respectively abut on lower portions of divisional cutting schedule lines DL2 to DL7.

Subsequently, when the pressing device 343 is further raised, the sheet 241 is extended upward, and is extended in a planar direction of the semiconductor substrate 21. Therefore, tensile stress is loaded to the semiconductor substrate 21 in the planar direction.

At this time, pressing projections 344*a* to 344*f* of the pressing device 343 locally press only divisional cutting schedule lines DL1 to DL7. Therefore, contact areas of the sheet 241 and the pressing projections 344*a* to 344*f* are greatly reduced in comparison with a pressing case on a flat face. Accordingly, no extension of the sheet 241 is restricted by frictional force with respect to the pressing projections 344*a* to 344*f*, and the sheet 241 can be uniformly extended. Therefore, sufficient stress can be also loaded to semiconductor chips near a central portion of the semiconductor substrate 21, e.g., semiconductor chips 22*c*, 22*d*. Accordingly, the semiconductor substrate 21 can be easily divisionally cut into semiconductor chips 22.

Further, the pressing projections 344*a* to 344*f* locally press only portions on divisional cutting schedule lines DL1 to DL7 so that bending stress is superposed on divisional cutting schedule lines DL1 to DL7 with contact portions of the pressing projections 344*a* to 344*f* as a center. Therefore, since larger stress can be loaded to divisional cutting schedule lines DL1 to DL7, a crack is easily developed on divisional cutting schedule lines DL1 to DL7. Accordingly, the semiconductor substrate 21 can be easily divisionally cut into semiconductor chips 22.

In this embodiment mode, the laser dicing method for irradiating the laser beam L from the substrate face 21*a* and forming the reforming area K within the semiconductor substrate 21 is illustrated as an example of the dicing method of the semiconductor substrate 21. Alternatively, the divisional cutting device 1 of this embodiment mode can be also applied to a divisional cutting device for loading stress and divisionally cutting the semiconductor substrate 21 after a notch is formed in the semiconductor substrate 21 by a diamond blade. Further, the divisional cutting device 1 of this embodiment mode can be also applied to a divisional cutting device for performing laser dicing and loading stress and divisionally cutting the semiconductor substrate 21 after the notch is formed in the semiconductor substrate 21 by the diamond blade.

The above device has the following effect.

(1) The pressing device 343 arranged in the divisional cutting device 1 of the semiconductor substrate locally presses the rear face of the sheet 241 adhered to the rear face of the semiconductor substrate 21. Accordingly, a portion in a position for generating stress for divisionally cutting the semiconductor chip 22 not easily divisionally cut on the rear face of the sheet 241 is locally pressed by the pressing projection 344. Thus, sufficient load is also loaded to the semiconductor chip 22 not easily divisionally cut, and the semiconductor chip 22 can be divisionally cut.

Further, since the contact area of the sheet 241 and the pressing projection 344 becomes small, no extension of the sheet 241 is restricted by frictional force with respect to the pressing device 343, and the sheet 241 can be uniformly extended. Therefore, the semiconductor substrate 21 can be easily divisionally cut, and yield of the semiconductor chip 22 can be improved.

Accordingly, it is possible to realize the divisional cutting device 1 and the divisional cutting method of the semiconductor substrate 21 able to improve yield of the divisional cutting of the semiconductor chip 22 obtained by divisionally cutting the semiconductor substrate 21.

(2) The pressing device 343 presses a portion in a position corresponding to the divisional cutting schedule line DL on the rear face of the sheet 241. Therefore, bending stress with the divisional cutting schedule line DL as a starting point can be generated in the semiconductor substrate 21. Accordingly, the semiconductor substrate 21 can be easily divisionally cut, and yield of the semiconductor chip 22 can be improved.

(3) The semiconductor substrate 21 can be diced after the semiconductor substrate 21 is adhered to the sheet 241 by applying the laser dicing method. Therefore, a dicing process can be shortened, and no dust is generated at a dicing time. Therefore, there is no fear that dust is attached to the substrate face 21*a* of the semiconductor substrate 21.

Twelfth Embodiment Mode

A twelfth embodiment mode of the divisional cutting device of the semiconductor substrate will be explained with reference to the drawings. FIGS. 21A and 21B are explanatory views of a pressing device in accordance with the twelfth embodiment mode. FIG. 21A is an explanatory view in which the pressing device is seen from above. FIG. 21B is a cross-sectional view of arrow XXIB-XXIB of FIG. 21A. FIGS. 22A and 22B are explanatory views of a divisional cutting method of the semiconductor substrate using the pressing device in accordance with the twelfth embodiment mode. FIG. 22A is an explanatory view of a state before the divisional cutting of the semiconductor substrate 21. FIG. 22B is an explanatory view of a state after the divisional cutting of the semiconductor substrate 21.

As shown in FIG. 21A, each pressing member 345 of a pin shape is arranged in the upper portion of a pressing device 343 so as to rise upward in a position corresponding to the central portion of a semiconductor chip 22. For example, as shown in FIG. 21B, pressing members 345*a* to 345*f* are arranged in six positions on line XXIB-XXIB corresponding to line XVIIB-XVIIB of FIG. 17A so as to have the same height.

First, as shown in FIG. 22A, the semiconductor substrate 21 forming a reforming area K (FIG. 18) therein is arranged above the pressing device 343 by a method similar to that of the eleventh embodiment mode, and a frame 242 is fixed.

Next, as shown in FIG. 22B, when the pressing device 343 is raised by an unillustrated raising-lowering means, pressing members 345*a* to 345*f* abut on the rear face side of the semiconductor substrate 21 through a sheet 241. At this time, the pressing member 345*a* abuts on a lower portion of a central portion of the bottom face of a semiconductor chip 22*a*. Similarly, pressing members 345*b* to 345*f* respectively abut on lower portions of the central portions of semiconductor chips 22*b* to 22*f*.

Subsequently, when the pressing device 343 is further raised, the sheet 241 is extended upward and is extended in a planar direction of the semiconductor substrate 21. Therefore, tensile stress is loaded to the semiconductor substrate 21 in the planar direction. At this time, pressing members 345*a* to 345*f* of the pressing device 343 locally press only lower portions of the central portions of semiconductor chips 22*a* to 22*f*.

Therefore, stress required for the divisional cutting can be properly loaded every semiconductor chips 22*a* to 22*f*. Further, bending stress can be generated in the semiconductor substrate 21 with the central portions of semiconductor chips 22*a* to 22*f* as a starting point. Accordingly, semiconductor chips 22*a* to 22*f* can be easily divisionally cut. Thus, the semiconductor substrate 21 can be easily divisionally cut into semiconductor chips 22.

In this embodiment mode, the construction for fixing the pressing member 345 to the upper portion of the pressing device 343 and pressing the semiconductor substrate 21 by raising the pressing device 343 is illustrated as an example. Alternatively, a construction in which each pressing member 345 has a direct-acting mechanism using a motor, etc. and can be individually raised and lowered may be also used.

Further, a construction in which each pressing member 345 has a mechanism for making a movement in the horizontal direction and is variably arranged may be also used. When this construction is used, the arrangement of the pressing member 345 can be changed in conformity with the arrangement of the semiconductor chip 22. Therefore, it is possible to cope with the divisional cutting of various semiconductor chips by one pressing device 343.

The above device has the following effect.

The pressing device 343 arranged in the divisional cutting device 1 of the semiconductor substrate presses a portion in a position corresponding to the central portion of the semiconductor chip 22 on the rear face of the sheet 241 adhered to the rear face of the semiconductor substrate 21. Therefore, stress required for the divisional cutting can be properly loaded every semiconductor chip 22. Further, bending stress can be generated in the semiconductor substrate 21 with the central portion of the semiconductor chip 22 as a starting point. Accordingly, the semiconductor substrate 21 can be easily divisionally cut, and yield of the semiconductor chip 22 can be improved.

Thirteenth Embodiment Mode

Figure 23A:
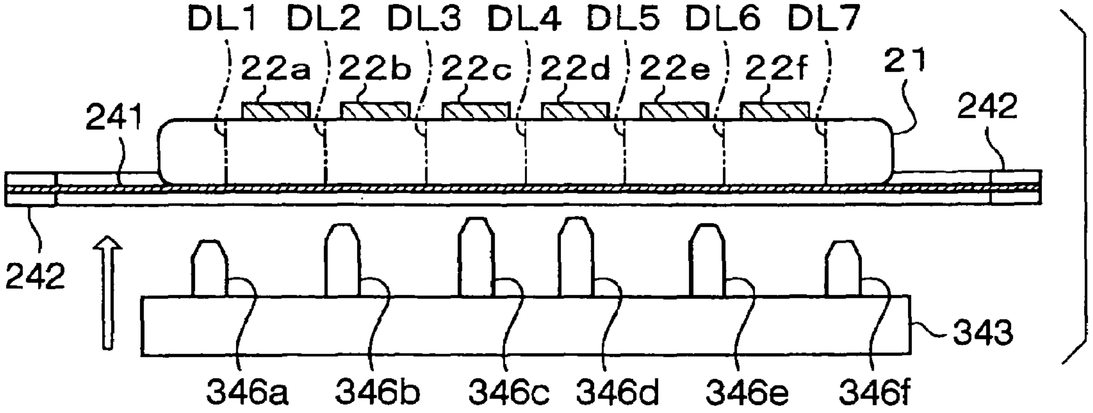
Figure 23B:
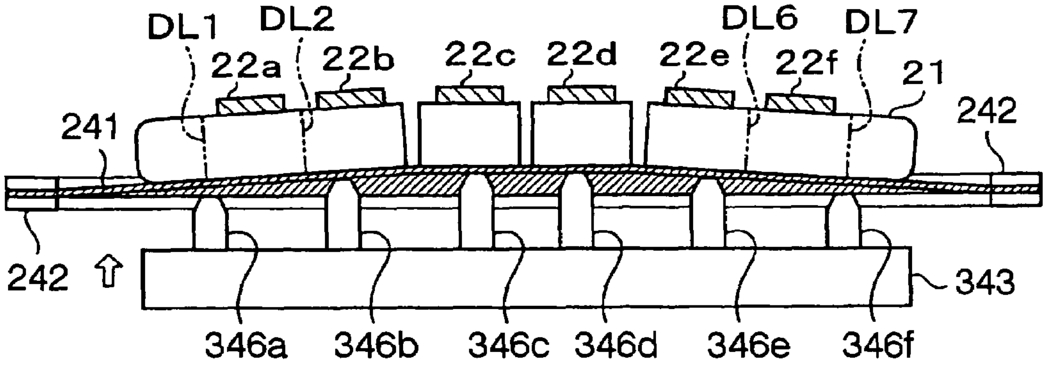
Figure 23C:
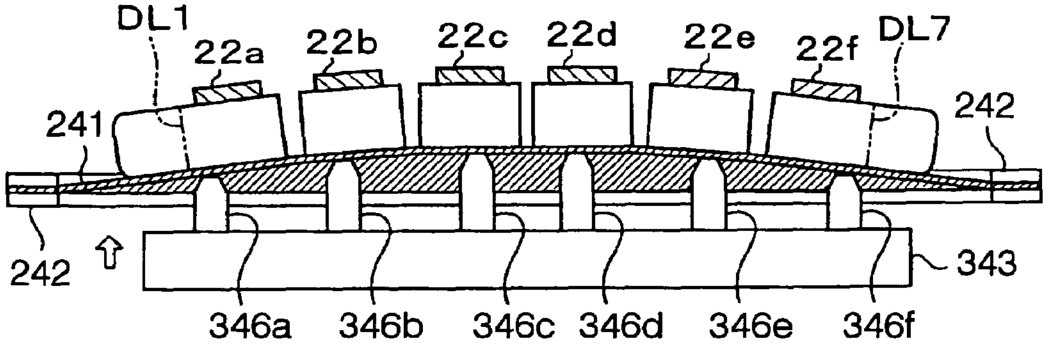
Figure 23D:
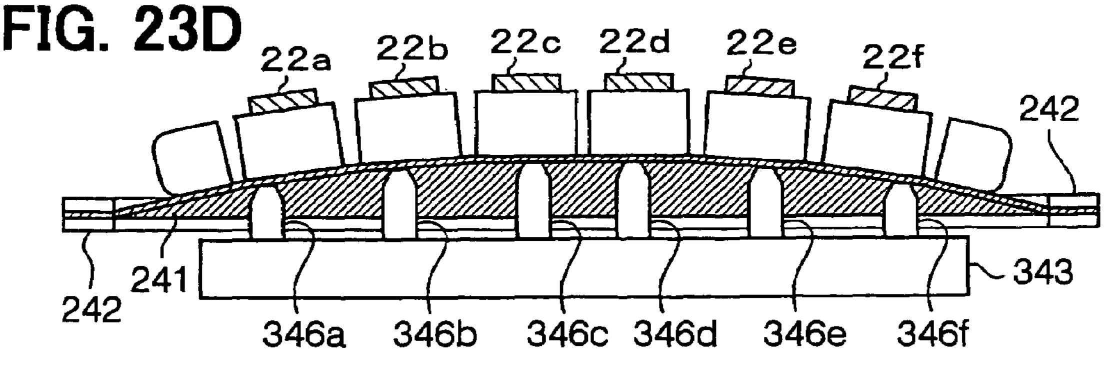

A third embodiment mode of the divisional cutting device of the semiconductor substrate will be explained with reference to the drawings. FIGS. 23A to 23D are explanatory views of a divisional cutting method of the semiconductor substrate using a pressing device in accordance with the thirteenth embodiment mode. FIG. 23A is an explanatory view of a state before the divisional cutting of the semiconductor substrate 21. FIG. 23B is an explanatory view of a process for divisionally cutting semiconductor chips 22*c*, 22*d*. FIG. 23C is an explanatory view of a process for divisionally cutting semiconductor chips 22*b*, 22*e*. FIG. 23D is an explanatory view of a process for divisionally cutting semiconductor chips 22*a*, 22*f*.

As shown in FIG. 23A, pressing members 346*a* to 346*f* of a pin shape are respectively arranged in the upper portion of a pressing device 343 in positions corresponding to the central portions of semiconductor chips 22*a* to 22*f* so as to be raised in height as pressing members 346*a* to 346*f* are close to a central portion of the semiconductor substrate 21. Namely, pressing members 346*c*, 346*d* closest to the central portion of the semiconductor substrate 21 are formed so as to be highest. Pressing members 346*b*, 346*e* are formed so as to be next high, and pressing members 346*a*, 346*f* are formed so as to be lowest.

Next, as shown in FIG. 23B, when the pressing device 343 is raised by an unillustrated moving means, only pressing members 346*c*, 346*d* closest to the central portion of the semiconductor substrate 21 respectively abut on lower portions of the central portions of semiconductor chips 22*c*, 22*d* from the rear face side of the semiconductor substrate 21, and locally press these lower portions. Thus, stress is concentratedly loaded on divisional cutting schedule lines DL3 to DL5. Accordingly, semiconductor chips 22*c*, 22*d* near the central portion not easily divisionally cut can be preferentially divisionally cut.

Subsequently, when the pressing device 343 is further raised, as shown in FIG. 23C, pressing members 346*b*, 346*e* respectively abut on lower portions of the central portions of semiconductor chips 22*b*, 22*e* from the rear face side of the semiconductor substrate 21, and locally press these lower portions. Thus, since stress is concentratedly loaded on divisional cutting schedule lines DL2, DL6, only semiconductor chips 22*b*, 22*e* are divisionally cut.

When the pressing device 343 is further raised, as shown in FIG. 23D, pressing members 346*a*, 346*f* respectively abut on lower portions of the central portions of semiconductor chips 22*a*, 22*f* from the rear face side of the semiconductor substrate 21, and locally press these lower portions. Thus, since load is concentratedly loaded on divisional cutting schedule lines DL1, DL7, semiconductor chips 22*a*, 22*f* are divisionally cut.

Namely, pressing members 346*a* to 346*f* arranged in the pressing device 343 sequentially press semiconductor chips 22*a* to 22*f* from a central direction of the semiconductor substrate 21 to its outer circumferential direction, and sequentially divisionally cut semiconductor chips 22*a* to 22*f* from the central direction to the outer circumferential direction.

In this embodiment mode, the construction for fixing the pressing member 346 to the upper portion of the pressing device 343 is illustrated as an example. Alternatively, a construction having a raising-lowering means for individually raising and lowering the pressing member 346 and setting the pressing member 346 to a predetermined height may be also used.

The above device has the following effect.

The pressing device 343 arranged in the divisional cutting device 1 of the semiconductor substrate sequentially presses a portion in a predetermined position of the rear face of the sheet 241 adhered to the rear face of the semiconductor substrate 21 from the central direction of the semiconductor substrate 21 to the outer circumferential direction. Therefore, the semiconductor substrate 21 can be preferentially divisionally cut from semiconductor chips 22*c*, 22*d* near the central portion of the semiconductor substrate 21 not easily divisionally cut. Accordingly, the semiconductor substrate 21 can be easily divisionally cut, and yield of the semiconductor chip 22 can be improved.

Similar effects can be also obtained when a construction for arranging the pressing projection 344 of the eleventh embodiment mode so as to be raised in height as the pressing projection 344 is close to the central portion of the semiconductor substrate 21 is used.

Fourteenth Embodiment Mode

Figure 24A:
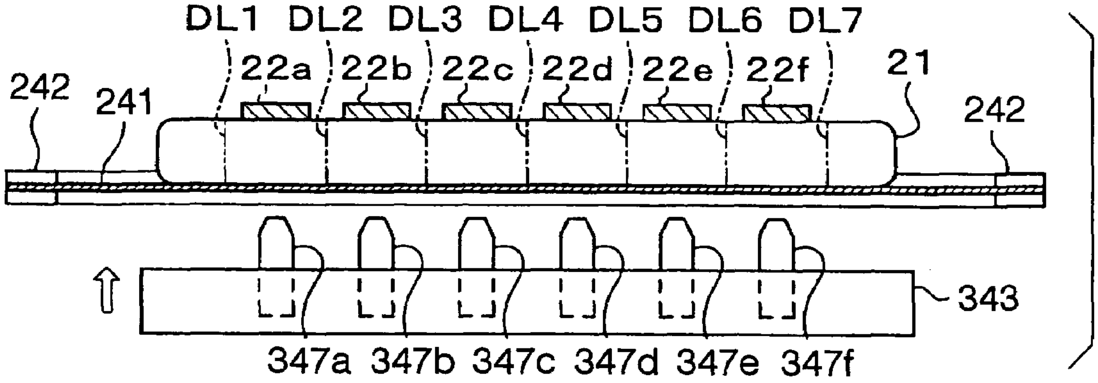
Figure 24B:
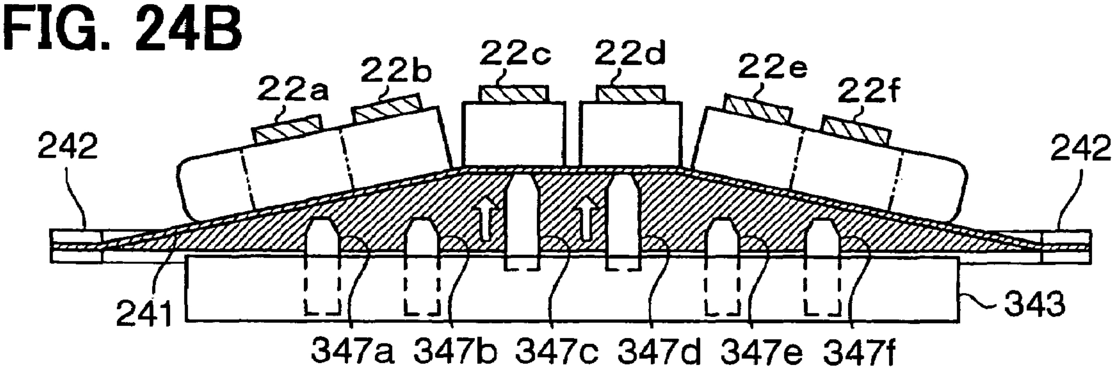
Figure 24C:
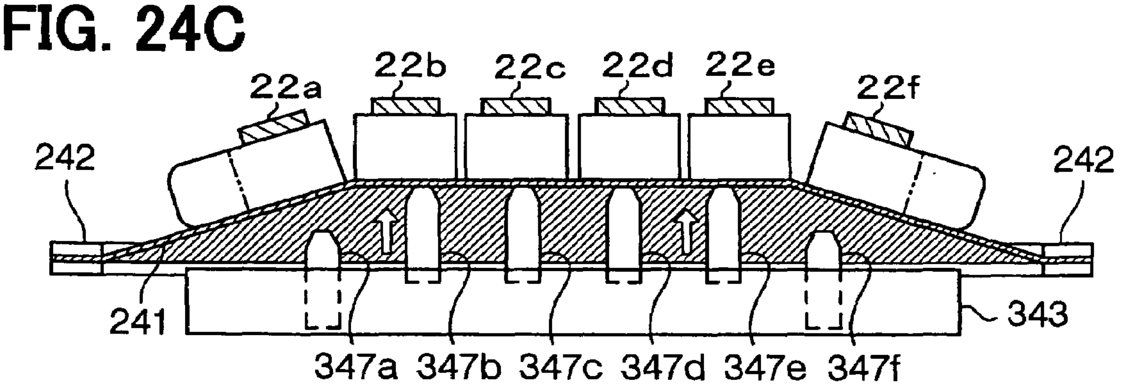
Figure 24D:
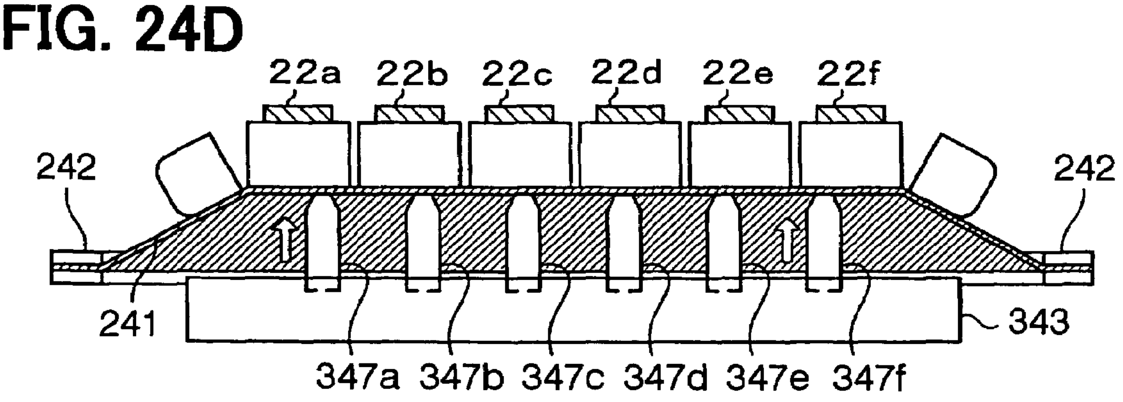

A fourteenth embodiment mode of the divisional cutting device of the semiconductor substrate will be explained with reference to the drawings. FIGS. 24A to 24D are explanatory views of a divisional cutting method of the semiconductor substrate using a pressing device in accordance with the fourteenth embodiment mode. FIG. 24A is an explanatory view of a state before the divisional cutting of the semiconductor substrate 21. FIG. 24B is an explanatory view of a process for divisionally cutting semiconductor chips 22*c*, 22*d*. FIG. 24C is an explanatory view of a process for divisionally cutting semiconductor chips 22*b*, 22*e*. FIG. 24D is an explanatory view of a process for divisionally cutting semiconductor chips 22*a*, 22*f*.

As shown in FIG. 24A, pressing members 347*a* to 347*f* of a pin shape are respectively arranged in the upper portion of the pressing device 343 in positions corresponding to the central portions of semiconductor chips 22*a* to 22*f* so as to be individually raised and lowered.

First, as shown in FIG. 24B, when the pressing device 343 is raised by an unillustrated moving means, only pressing members 347*c*, 347*d* closest to the central portion of the semiconductor substrate 21 are raised, and respectively abut on lower portions of the central portions of semiconductor chips 22*c*, 22*d* from the rear face side of the semiconductor substrate 21, and locally press these lower portions. Thus, since stress is concentratedly loaded on divisional cutting schedule lines DL3 to DL5, semiconductor chips 22*c*, 22*d* near the central portion not easily divisionally cut can be preferentially divisionally cut.

Subsequently, as shown in FIG. 24C, pressing members 347*b*, 347*e* are raised, and respectively abut on lower portions of the central portions of semiconductor chips 22*b*, 22*e* from the rear face side of the semiconductor substrate 21, and locally press these lower portions. Thus, since stress is concentratedly loaded on divisional cutting schedule lines DL2, DL6, only semiconductor chips 22*b*, 22*e* are divisionally cut.

Further, as shown in FIG. 24D, pressing members 347*a*, 347*f* are raised and respectively abut on lower portions of the central portions of semiconductor chips 22*a*, 22*f* from the rear face side of the semiconductor substrate 21, and locally press these lower portions. Thus, since stress is concentratedly loaded on divisional cutting schedule lines DL1, DL7, semiconductor chips 22*a*, 22*f* are divisionally cut.

Namely, pressing members 347*a* to 347*f* arranged in the pressing device 343 are sequentially raised from the central direction of the semiconductor substrate 21 to the outer circumferential direction, and press portions in positions corresponding to the central portions of semiconductor chips 22*a* to 22*f*. Then, semiconductor chips 22*a* to 22*f* are sequentially divisionally cut from the central direction to the outer circumferential direction.

Here, the semiconductor chip of the central direction previously divisionally cut is held by the pressing member from the rear face. Therefore, since the sheet 241 is horizontally stably held, no crack is deflected when the semiconductor chip of the outer circumferential direction is divisionally cut. Accordingly, yield of the semiconductor chip 22 can be improved.

The above device has the following effect.

The pressing device 343 arranged in the divisional cutting device 1 of the semiconductor substrate sequentially presses a portion in a predetermined position of the rear face of the sheet 241 adhered to the rear face of the semiconductor substrate 21 from the central direction of the semiconductor substrate 21 to the outer circumferential direction. Therefore, the semiconductor substrate 21 can be preferentially divisionally cut from semiconductor chips 22*c*, 22*d* near the central portion of the semiconductor substrate 21 not easily divisionally cut. Accordingly, the semiconductor substrate 21 can be easily divisionally cut, and yield of the semiconductor chip 22 can be improved.

Similar effects can be also obtained when the pressing projection 344 of the eleventh embodiment mode is constructed so as to be individually raised and lowered, and the semiconductor substrate is sequentially pressed from the central direction of the semiconductor substrate 21 to the outer circumferential direction.

Fifteenth Embodiment Mode

Figure 25A:
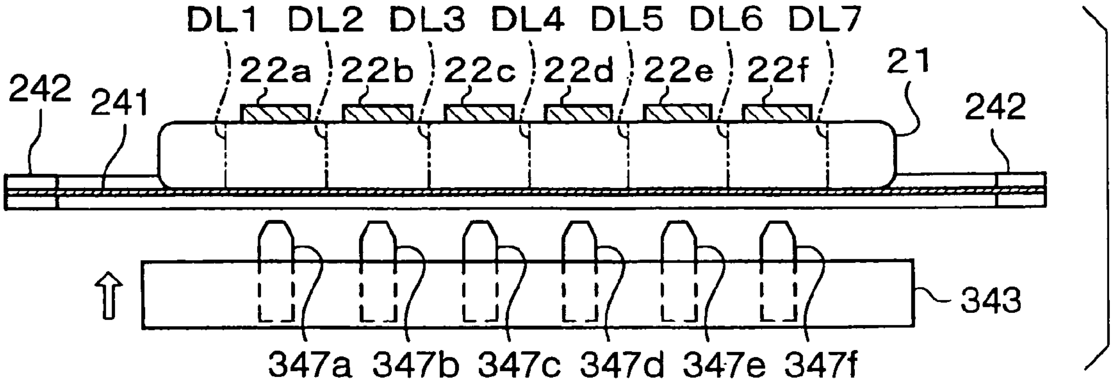
Figure 25B:
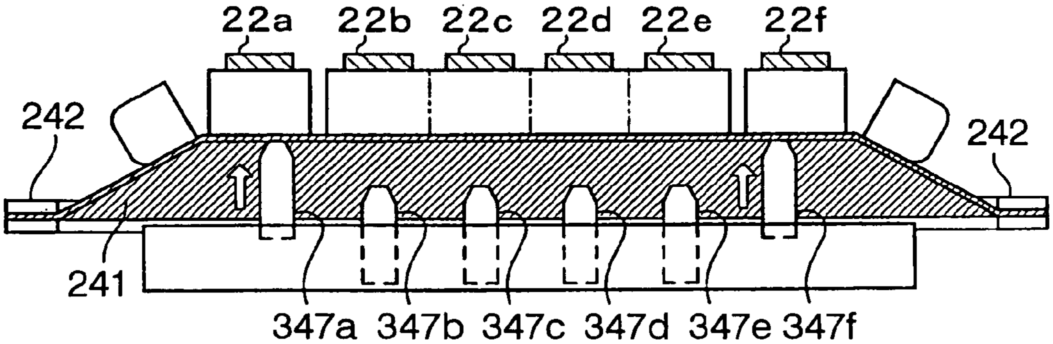
Figure 25C:
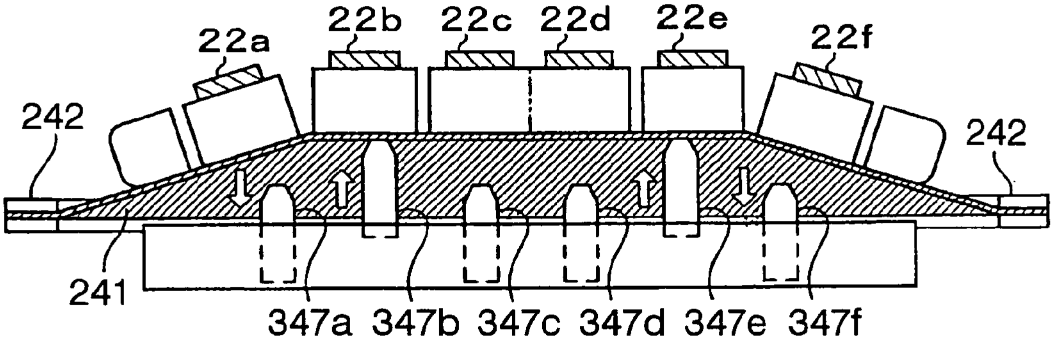
Figure 25D:
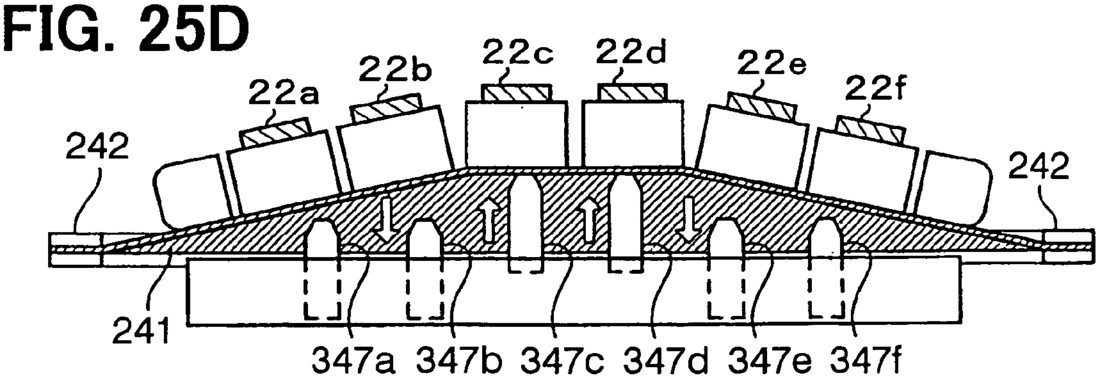

A fifth embodiment mode of the divisional cutting device of the semiconductor substrate will be explained with reference to the drawings. FIGS. 25A to 25D are explanatory views of a divisional cutting method of the semiconductor substrate using a pressing device in accordance with the fifteenth embodiment mode. FIG. 25A is an explanatory view of a state before the divisional cutting of the semiconductor substrate 21. FIG. 25B is an explanatory view of a process for divisionally cutting semiconductor chips 22*a*, 22*f*. FIG. 25C is an explanatory view of a process for divisionally cutting semiconductor chips 22*b*, 22*e*. FIG. 25D is an explanatory view of a process for divisionally cutting semiconductor chips 22*c*, 22*d*.

As shown in FIG. 25A, similar to the fourteenth embodiment mode, pressing members 347*a* to 347*f* of a pin shape are respectively arranged in the upper portion of the pressing device 343 in positions corresponding to the central portions of semiconductor chips 22*a* to 22*f* so as to be individually raised and lowered.

First, as shown in FIG. 25B, when the pressing device 343 is raised by an unillustrated moving means, only pressing members 347*a*, 347*f* on the outermost circumferential side of the semiconductor substrate 21 are raised and respectively abut on lower portions of the central portions of semiconductor chips 22*a*, 22*f* from the rear face side of the semiconductor substrate 21, and locally press these lower portions. Thus, since stress is concentratedly loaded on divisional cutting schedule lines DL1, DL2, DL6, DL7, semiconductor chips 22*c*, 22*d* near an outer circumferential portion can be preferentially divisionally cut.

At this time, since semiconductor chips 22*a*, 22*f* of the outer circumferential direction of the semiconductor substrate 21 are reliably divisionally cut, there is no case in which the sheet 241 is excessively extended and no force is applied to the central portion.

Subsequently, as shown in FIG. 25C, pressing members 347*a*, 347*f* are lowered and pressing members 347*b*, 347*e* are raised, and respectively abut on lower portions of the central portions of semiconductor chips 22*b*, 22*e* from the rear face side of the semiconductor substrate 21, and locally press these lower portions. Thus, since stress is concentratedly loaded on divisional cutting schedule lines DL3, DL5, only semiconductor chips 22*b*, 22*e* are divisionally cut.

Subsequently, as shown in FIG. 25D, pressing members 347*b*, 347*e* are lowered and pressing members 347*c*, 347*d* are raised and respectively abut on lower portions of the central portions of semiconductor chips 22*c*, 22*d* from the rear face side of the semiconductor substrate 21, and locally press these lower portions. Thus, since stress is loaded on divisional cutting schedule line DL4, semiconductor chips 22*c*, 22*d* are divisionally cut.

Namely, pressing members 347*a* to 347*f* arranged in the pressing device 343 are sequentially raised from the outer circumferential direction of the semiconductor substrate 21 to the central direction, and press portions in positions corresponding to the central portions of semiconductor chips 22*a* to 22*f*. Then, semiconductor chips 22*a* to 22*f* are sequentially divisionally cut from the outer circumferential direction to the central direction.

The above device has the following effect.

The pressing device 343 arranged in the divisional cutting device 1 of the semiconductor substrate sequentially presses a portion in a predetermined position of the rear face of a sheet 241 adhered to the rear face of the semiconductor substrate 21 from the outer circumferential direction of the semiconductor substrate 21 to the central direction. Therefore, the semiconductor substrate 21 is reliably divisionally cut from the semiconductor chip 22 of the outer circumferential direction of the semiconductor substrate 21. Accordingly, even when the semiconductor chip 22 not easily divisionally cut exists near the outer circumference of the semiconductor substrate 21, there is no case in which the sheet 241 is excessively extended and no force is applied to the central portion of the semiconductor substrate 21. Accordingly, the semiconductor substrate 21 can be easily divisionally cut, and yield of the semiconductor chip 22 can be improved.

Modifications of Eleventh to Fifteenth Embodiment Modes (1) When the rear face of the sheet 241 is pressed by the pressing device 343, a vibration may be also given to the semiconductor substrate 21 by using a vibrating means such as an ultrasonic vibrator, etc. When this construction is used, a crack can be developed from the reforming area K by a physical action of the vibration, and force required in the divisional cutting can be reduced. Accordingly, the semiconductor substrate 21 can be easily divisionally cut, and yield of the semiconductor chip 22 can be improved.

(2) When the rear face of the sheet 241 is pressed by the pressing device 343, the semiconductor substrate 21 may be also heated by using a heating means such as a heater, etc. When this construction is used, thermal stress can be loaded to the reforming area K, and force required in the divisional cutting can be reduced. Accordingly, the semiconductor substrate 21 can be easily divisionally cut, and yield of the semiconductor chip 22 can be improved.

(3) The semiconductor substrate constructed by only silicon is used in the semiconductor substrate 21. Alternatively, a construction in which an oxide film constructed by silicon oxide is formed on the substrate face 21*a* of the semiconductor substrate 21 may be used, and a wafer may be a SOI (Silicon On Insulator).

The above disclosure has the following aspects.

According to a first aspect of the present disclosure, a separating device for separating a semiconductor substrate includes: a cutting element for cutting the semiconductor substrate into a plurality of chips along with a cutting line on the semiconductor substrate; an adsorbing element for adsorbing a dust on a surface of the semiconductor substrate by using electrostatic force; and a static electricity generating element for generating static electricity and for controlling the static electricity in order to remove the dust from the adsorbing element.

In the above device, an attachment substance removing means having an adsorbing means and a static electricity generating means is arranged. The adsorbing means adsorbs an attachment substance attached to the substrate face of a semiconductor substrate by electrostatic force. The static electricity generating means induces static electricity in this adsorbing means, and controls the magnitude of electrostatic force. Therefore, the adsorbing means attracts and adsorbs the attachment substance attached to the substrate face. Accordingly, the attachment substance can be removed without moving the attachment substance in a wide range. Further, since no attachment substance is scattered, the attachment substance can be efficiently removed in comparison with a case for blowing-off the attachment substance by air cleaning, etc. Accordingly, it is possible to realize a divisional cutting device of the semiconductor substrate able to efficiently remove the attachment substance attached to the substrate face of the semiconductor substrate without having any bad influence on a product.

Alternatively, the device may further include a reforming region forming element for forming a reforming region in the semiconductor substrate. The reforming region forming element includes a laser head for irradiating a laser beam on the semiconductor substrate along with the cutting line so that the reforming region is formed at a focus point in the semiconductor substrate by a multi-photon absorbing effect, and the semiconductor substrate having the reforming region is separated from the reforming region as a starting point of separation. In this case, a reforming area forming means is arranged. While a laser head for irradiating a laser beam is relatively moved with respect to the semiconductor substrate along a divisional cutting schedule line, the reforming area forming means irradiates the laser beam by conforming a convergent point to the interior of the semiconductor substrate, and forms a reforming area using multiphoton absorption at the convergent point. The above device is preferably used in a structure having a construction for divisionally cutting the semiconductor substrate formed via this reforming area forming process with the reforming area as a starting point. Namely, the attachment substance generated from the semiconductor substrate at a divisional cutting time of the semiconductor substrate using a divisional cutting means can be adsorbed by the adsorbing means. Therefore, it is possible to realize a divisional cutting device of the semiconductor substrate able to efficiently remove the attachment substance attached to the substrate face of the semiconductor substrate without having any bad influence on a product.

Alternatively, the adsorbing element and the static electricity generating element may provide a dust removing element, and the dust removing element may be capable of removing the dust together with irradiation of the laser beam by the laser head. In this case, the attachment substance removing means is operated when at least the reforming area forming means irradiates the laser beam. Therefore, no irradiation of the laser beam is obstructed by the attachment substance attached to the substrate face.

Alternatively, the adsorbing element may be capable of transmitting the laser beam therethrough, and the adsorbing element is disposed between the laser head and the semiconductor substrate. In this case, the adsorbing means transmits the laser beam, and the attachment substance removing means is arranged between the laser head and the substrate face. Therefore, while the attachment substance is removed, the laser beam can be irradiated. Accordingly, no irradiation of the laser beam is obstructed by the attachment substance, and an attachment substance generated from the semiconductor substrate by the irradiation of the laser beam can be removed.

Alternatively, the adsorbing element and the static electricity generating element may provide a dust removing element, and the dust removing element may remove the dust, which is generated in a case where the cutting element cuts the semiconductor substrate. In this case, the attachment substance removing means removes the attachment substance generated when the semiconductor substrate is divisionally cut by the divisional cutting means. Therefore, there is no fear that the attachment substance has a bad influence on a product.

Alternatively, the adsorbing element may have an adsorbing surface, which faces all of the semiconductor substrate, and the dust is adsorbed on the adsorbing surface of the adsorbing element. In this case, an adsorbing face for adsorbing the attachment substance of the adsorbing means is formed so as to be opposed to the entire substrate face. Therefore, the attachment substance attached to the entire substrate face can be adsorbed to the adsorbing means at one time. Further, it is not necessary to move the adsorbing means in a wide range so as to be opposed to the substrate face. Accordingly, removing efficiency of the attachment substance can be raised. Further, since no attachment substance is left, the influence of the attachment substance on a product can be wept away.

Alternatively, the adsorbing element may further include an adhesive layer facing the semiconductor substrate, and the adhesive layer adheres the dust, which is adsorbed by the adsorbing element. In this case, an adhesive member is arranged on a face of the substrate face side of the adsorbing means. In the adhesive member, an adhesive layer for catching the attachment substance attracted by the adsorbing means is formed on the substrate face side. Therefore, the attachment substance can be caught by the adhesive layer. Accordingly, the attachment substance can be maintained in a catching state even when electrostatic force generated in the adsorbing means is eliminated. The attachment substance can be collected by merely removing the adhesive member. Further, when the adhesive member can be replaced, no labor for removing the attachment substance of the face of the substrate face side by wiping-off, etc. is required. Accordingly, the attachment substance can be efficiently removed.

Alternatively, the adsorbing element may have a mesh structure. In this case, the adsorbing means is a member of a mesh shape. Therefore, the laser beam can be irradiated to the semiconductor substrate through meshes.

Alternatively, the adsorbing element may include a plurality of adsorbing meshes, which are stacked in a direction perpendicular to the semiconductor substrate. The adsorbing meshes are stacked by a predetermined distance, and the static electricity generating element controls an electric potential of each adsorbing mesh. In this case, the attachment substance removing means has plural adsorbing means arranged at a predetermined interval such that the adsorbing means of the substrate face side is constructed by a member of a mesh shape. The electric potential between the above laminated adsorbing means can be changed by the static electricity generating means. Therefore, the size of the attachment substance can be distinguished by the adsorbing means of the substrate face side and the other adsorbing means. Thus, the adsorbed attachment substance can be efficiently collected from the adsorbing means by controlling the electric potential between the adsorbing means.

Alternatively, the laser head may be capable of scanning the laser beam along with a scanning direction parallel to the semiconductor substrate. At least a part of the adsorbing element is disposed on a side to be scanned by the laser beam, and the part of the adsorbing element is displaceable in accordance with movement of the laser head. In this case, at least one portion of the adsorbing member is arranged on a scanning direction side of the laser beam. When the laser beam is irradiated from the laser head, the adsorbing member is relatively moved with respect to the semiconductor substrate in association with the laser head. Therefore, the attachment substance obstructing the irradiation of the laser beam can be removed before the laser beam is irradiated. Accordingly, the laser beam can be properly irradiated.

Alternatively, the device may further include a separation element for removing the dust from the adsorbing element. In this case, a separating means for separating the attachment substance adsorbed by the adsorbing member from the adsorbing member is arranged. Therefore, the surface of the adsorbing member can be cleaned, and no adsorption force is reduced. Further, no attachment substance left from the adsorbing means is again attached to the substrate face.

Alternatively, the separation element may displace the adsorbing element to a predetermined position, at which the adsorbing element does not face the semiconductor substrate, and the separation element collects the dust removed from the adsorbing element when the static electricity generating element stops to generate the static electricity. In this case, the separating means moves the adsorbing means to a position not opposed to the semiconductor substrate. The attachment substance adsorbed by the adsorbing means is separated by interrupting electrostatic force generated in the adsorbing means by the static electricity generating means. Therefore, it is possible to reliably prevent that the collected attachment substance is again attached to the substrate face. Thus, the attachment substance can be efficiently collected.

Alternatively, the device may further include a vibrating element for vibrating the semiconductor substrate. In this case, a vibrating means for giving a vibration to the semiconductor substrate is arranged. Therefore, adhesive force of the attachment substance to the substrate face can be weakened by the vibration of the semiconductor substrate. Accordingly, the attachment substance can be efficiently removed.

According to a second aspect of the present disclosure, a method for separating a semiconductor substrate includes: cutting the semiconductor substrate into multiple chips along with a cutting line on the semiconductor substrate; adsorbing a dust on a surface of the semiconductor substrate by using electrostatic force; and controlling static electricity in order to adsorb the dust and to remove the dust from the adsorbing element.

In the above method, an adsorbing process for adsorbing the attachment substance attached to the substrate face of the semiconductor substrate by electrostatic force, and a static electricity generating process for controlling the magnitude of the above electrostatic force are arranged in a divisional cutting method of the semiconductor substrate. Therefore, the attachment substance attached to the substrate face is attracted and adsorbed in the adsorbing process. Accordingly, the attachment substance can be removed without moving the attachment substance in a wide range. Further, since no attachment substance is scattered, the attachment substance can be efficiently removed in comparison with a case in which the attachment substance is blown off by air cleaning, etc. Accordingly, it is possible to realize a divisional cutting method of the semiconductor substrate able to efficiently remove the attachment substance attached to the substrate face of the semiconductor substrate without having any bad influence on a product.

According to a third aspect of the present disclosure, a separating device for separating a semiconductor substrate into a plurality of chips along with a cutting line on the semiconductor substrate is provided. The semiconductor substrate includes a region capable of reducing a stress for separating the semiconductor substrate, and the region is disposed along with the cutting line. The device includes: a holding element for holding a part of the semiconductor substrate, the part which corresponds to one of the chips and are surrounded with the cutting line; and a force applying element for applying a force to the part of the semiconductor substrate through the holding element in order to separate the one of the chips from the semiconductor substrate.

In the above device, the stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing device of the semiconductor chip able to improve yield of the semiconductor chip obtained by dividing the semiconductor substrate.

Alternatively, the force applying element may apply the force in a predetermined direction to the part of the semiconductor substrate so that a shear stress is applied to the part of the semiconductor substrate, and the predetermined direction of the force is a direction away from the semiconductor substrate. In this case, a predetermined member is attached to a portion surrounded by the circumference of a semiconductor chip and a divisional scheduled line on a substrate face. Force operated in a direction separated from the substrate face is applied to this predetermined member. Accordingly, it is possible to realize a manufacturing device of the semiconductor chip able to improve yield of the semiconductor chip obtained by dividing the semiconductor substrate.

Alternatively, the force applying element may apply the force in a predetermined direction to the part of the semiconductor substrate so that a shear stress is applied to the part of the semiconductor substrate, and the predetermined direction of the force is a pushing direction of the part of the semiconductor substrate. In this case, a predetermined member is attached to a portion surrounded by the circumference of a semiconductor chip and a divisional scheduled line on a substrate face. Force operated in a direction for pressing the above substrate face is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing device of the semiconductor chip able to improve yield of the semiconductor chip obtained by dividing the semiconductor substrate. Further, force for attaching the predetermined member may be set to force of a degree not shifted from a direction for loading stress at a pressing time. Accordingly, force required in attachment can be reduced.

Alternatively, the force applying element may apply the force in a predetermined direction to the part of the semiconductor substrate so that a stress is applied to the part of the semiconductor substrate. The predetermined direction of the force is a direction away from the semiconductor substrate, and the part of the semiconductor substrate is disposed on a periphery of the semiconductor substrate. In this case, a predetermined member is attached to a portion surrounded by the circumference of a semiconductor chip located in an end portion of a semiconductor substrate and a divisional scheduled line on a substrate face. Force operated in a direction separated from the semiconductor substrate in a planar direction of the semiconductor substrate is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing device of the semiconductor chip able to improve yield of the semiconductor chip obtained by dividing the semiconductor substrate. Further, when the semiconductor chip is divided, the semiconductor chip is relatively moved in the direction separated from the semiconductor substrate in a planar direction of the semiconductor substrate. Therefore, since no divided faces are rubbed, there is no fear of generation of chipping in the semiconductor chip.

Alternatively, the semiconductor substrate may have a first surface and a second surface. The semiconductor substrate further includes a plurality of semiconductor elements, each of which corresponds to the chip. The semiconductor elements are disposed on the first surface of the semiconductor substrate. The holding element holds the part of the semiconductor substrate from the second surface of the semiconductor substrate. The force applying element applies the force in a predetermined direction to the part of the semiconductor substrate so that a shear stress is applied to the part of the semiconductor substrate. The predetermined direction of the force is a direction away from the semiconductor substrate. In this case, a predetermined member is attached in a position corresponding to a portion surrounded by a divisional scheduled line of the other substrate face of a semiconductor substrate. Force operated in a direction separated from the above other substrate face is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving is removed. Accordingly, it is possible to realize a manufacturing device of the semiconductor chip able to improve yield of the semiconductor chip obtained by dividing the semiconductor substrate. Further, since the predetermined member is attached to a face forming no semiconductor element thereon, there is no fear of damage of the semiconductor element.

Alternatively, the device may further include a biasing element for biasing an adjacent part of the semiconductor substrate. The adjacent part is adjacent to the part of the semiconductor substrate, surrounded with the cutting line, and corresponds to an adjacent chip. The force applying element applies the force in a first direction to the part of the semiconductor substrate, and the biasing element biases the adjacent part of the semiconductor substrate in a second direction opposite to the first direction. Further, the semiconductor substrate may have a first surface and a second surface. The semiconductor substrate further includes a plurality of semiconductor elements, each of which corresponds to the chip. The semiconductor elements are disposed on the first surface of the semiconductor substrate, and the biasing element biases the adjacent part of the semiconductor substrate from the second surface of the semiconductor substrate. In this case, a biasing means for performing biasing in a direction reverse to an application direction of force applied by a predetermined member is arranged in a portion surrounded by the above line and the circumference of at least one semiconductor element adjacent to the semiconductor element corresponding to an attaching portion of the predetermined member, or is arranged on the other substrate face side of the semiconductor substrate corresponding to the portion surrounded by the above line. Therefore, when stress is loaded by the predetermined member, deformation of the semiconductor substrate except for the attaching portion of the predetermined member is restrained, and stress can be concentratedly loaded to the above area only a divisional scheduled semiconductor chip can be reliably divided.

Alternatively, the device may further include: a sheet; a frame for holding a periphery of the sheet; and an expansion element for expanding the sheet. The semiconductor substrate has a first surface and a second surface. The semiconductor substrate further includes a plurality of semiconductor elements, each of which corresponds to the chip. The semiconductor elements are disposed on the first surface of the semiconductor substrate, and the second surface of the semiconductor substrate is bonded to the sheet. In this case, a sheet is extended when stress is loaded to the semiconductor substrate. Thus, tensile stress is loaded to the semiconductor substrate in the planar direction. Therefore, since stress applied to the above area is increased, the semiconductor substrate can be further easily divided.

Alternatively, the expansion element may be a pressing element for pressing the sheet from one side of the sheet, which is opposite to the semiconductor substrate, and the sheet is expanded by pressing with the pressing element. In this case, the sheet is extended by one simple operation in which the rear face of the sheet is pressed by a pressing means. Therefore, the semiconductor substrate can be divided by more efficiently loading stress to the entire semiconductor substrate.

Alternatively, the device may further include: a reforming region forming element for forming a reforming region in the semiconductor substrate. The reforming region forming element includes a laser head for irradiating a laser beam on the semiconductor substrate along with the cutting line so that the reforming region is formed at a focus point in the semiconductor substrate by a multi-photon absorbing effect, and the semiconductor substrate having the reforming region is separated from the reforming region as a starting point of separation. In this case, a reforming area forming means is arranged. While a laser head for irradiating a laser beam is relatively moved with respect to the above semiconductor substrate along a divisional schedule line, the reforming area forming means irradiates the laser beam by conforming a convergent point to the interior of the semiconductor substrate, and forms a reforming area using multiphoton absorption at the convergent point. The above device is suitably used in a structure having a construction for dividing the semiconductor substrate formed via this reforming area forming process with the reforming area as a starting point. Namely, since the reforming area is formed within the semiconductor substrate by the irradiation of the laser beam, no dust is generated as in a case for performing dicing by a diamond blade, etc. Accordingly, there is no fear that dust is attached to the substrate face of the semiconductor substrate.

Alternatively, the device may further include a transport element for transporting the one of the chips to a latter mounting process. In this case, the predetermined member is transferred to a mounting process of the semiconductor chip in an attaching state of the divided semiconductor chip. Therefore, in comparison with a method for picking-up and transferring the semiconductor chip to the mounting process after the semiconductor chip is divided, time can be shortened, and the semiconductor chip can be reliably transferred to the mounting process without failing in the pickup of the semiconductor chip.

According to a fourth aspect of the present disclosure, a method for separating a semiconductor substrate includes: preparing the semiconductor substrate having first and second surfaces, wherein a plurality of semiconductor elements is disposed on the first surface of the semiconductor substrate; cutting the semiconductor substrate into multiple chips along with a cutting line on the semiconductor substrate, wherein each chip includes at least one semiconductor element; forming a region for reducing a stress in order to separate the semiconductor substrate, wherein the region is disposed along with the cutting line; attaching a holding element on a part of the semiconductor substrate, the part which corresponds to one of the chips and are surrounded with the cutting line; and applying a force to the part of the semiconductor substrate through the holding element in order to separate the one of the chips from the semiconductor substrate.

In the above method, the stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing method of the semiconductor chip able to improve yield of the semiconductor chip obtained by dividing the semiconductor substrate.

Alternatively, the force may be applied in a predetermined direction to the part of the semiconductor substrate so that a shear stress is applied to the part of the semiconductor substrate, and the predetermined direction of the force is a direction away from the semiconductor substrate. In this case, a predetermined member is attached to a portion surrounded by the circumference of a semiconductor chip and a divisional scheduled line on a substrate face. Force operated in a direction separated from the substrate face is applied to this predetermined member. Thus, it is possible to realize a manufacturing method of the semiconductor chip able to improve yield of the semiconductor chip obtained by dividing the semiconductor substrate.

Alternatively, the force may be applied in a predetermined direction to the part of the semiconductor substrate so that a shear stress is applied to the part of the semiconductor substrate, and the predetermined direction of the force is a pushing direction of the part of the semiconductor substrate. In this case, a predetermined member is attached to a portion surrounded by the circumference of a semiconductor chip and a divisional scheduled line on a substrate face. Force operated in a direction for pressing the above substrate face is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing method of the semiconductor chip able to improve yield of the semiconductor chip obtained by dividing the semiconductor substrate. Further, force for attaching the predetermined member may be set to force of a degree not shifted from a direction for loading stress at a pressing time. Accordingly, force required in attachment can be reduced.

Alternatively, the force may be applied in a predetermined direction to the part of the semiconductor substrate so that a stress is applied to the part of the semiconductor substrate. The predetermined direction of the force is a direction away from the semiconductor substrate, and parallel to the semiconductor substrate, and the part of the semiconductor substrate is disposed on a periphery of the semiconductor substrate. In this case, a predetermined member is attached to a portion surrounded by the circumference of a semiconductor chip located in an end portion of a semiconductor substrate and a divisional scheduled line on a substrate face. Force operated in a direction separated from the semiconductor substrate in a planar direction of the semiconductor substrate is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving of the semiconductor chip near the center of the semiconductor substrate is removed. Accordingly, it is possible to realize a manufacturing method of the semiconductor chip able to improve yield of the semiconductor chip obtained by dividing the semiconductor substrate. Further, when the semiconductor chip is divided, the semiconductor chip is relatively moved in the direction separated from the semiconductor substrate in a planar direction of the semiconductor substrate. Therefore, since no divided faces are rubbed, there is no fear of generation of chipping in the semiconductor chip.

Alternatively, the force may be applied in a predetermined direction to the part of the semiconductor substrate so that a shear stress is applied to the part of the semiconductor substrate. The predetermined direction of the force is a direction away from the semiconductor substrate, and the holding element is attached to the part of the semiconductor substrate from the second surface of the semiconductor substrate. In this case, a predetermined member is attached in a position corresponding to a portion surrounded by a divisional scheduled line of the other substrate face of a semiconductor substrate. Force operated in a direction separated from the above other substrate face is applied to this predetermined member. Thus, stress can be reliably loaded to an area formed in a thickness direction to reduce stress required in division in the thickness direction correspondingly to the divisional scheduled line set on the substrate face between respective semiconductor elements. Therefore, the semiconductor substrate can be reliably divided in the thickness direction of the above line every semiconductor element attaching the predetermined member thereto, and crack leaving is removed. Accordingly, it is possible to realize a manufacturing method of the semiconductor chip able to improve yield of the semiconductor chip obtained by dividing the semiconductor substrate. Further, since the predetermined member is attached to a face forming no semiconductor element thereon, there is no fear of damage of the semiconductor element.

According to a fifth aspect of the present disclosure, a separating device for separating a semiconductor substrate into a plurality of chips along with a cutting line on the semiconductor substrate includes: a sheet for bonding the semiconductor substrate thereon; a frame for holding a periphery of the sheet; and a pressing element for locally pressing the sheet from a side of the sheet opposite to the semiconductor substrate. The sheet is expanded so that the semiconductor substrate is separated into the chips when the pressing element presses the sheet.

In the above device, i.e., in a divisional cutting device of a semiconductor substrate for divisionally cutting the semiconductor substrate and obtaining a semiconductor chip by pressing the rear face of a sheet adhering the semiconductor substrate thereto by a pressing means and extending the sheet, it is possible to select a place for pressing the rear face of the sheet by the pressing means. Therefore, it is possible to locally press a portion in a position for generating stress on a divisional cutting schedule line not easily divisionally cut. Accordingly, the semiconductor substrate can be easily divisionally cut by loading sufficient load on the divisional cutting schedule line not easily divisionally cut. Further, since a contact area of the sheet and a pressing member becomes small, no extension of the sheet is restricted by frictional force with respect to the pressing member, and the sheet can be uniformly extended. Therefore, the semiconductor substrate can be easily divisionally cut, and yield of the semiconductor chip can be improved. Accordingly, it is possible to realize the divisional cutting device of the semiconductor substrate able to improve yield of the semiconductor chip obtained by divisionally cutting the semiconductor substrate.

Alternatively, the pressing element locally may press a part of the sheet, which corresponds to the cutting line. In this case, the pressing member presses a portion in a position corresponding to the divisional cutting schedule line of the rear face of the sheet. Therefore, bending stress can be generated in the semiconductor substrate with the divisional cutting schedule line as a starting point. Accordingly, the semiconductor substrate can be easily divisionally cut, and yield of the semiconductor chip can be improved.

Alternatively, the pressing element locally may press a part of the sheet, which corresponds to a center of one of the chips. In this case, since the pressing member presses a portion in a position corresponding to a central portion of the semiconductor chip of the rear face of the sheet, stress required for the divisional cutting can be properly loaded every semiconductor chip. Further, bending stress can be generated in the semiconductor substrate with the central portion of the semiconductor chip as a starting point. Accordingly, the semiconductor substrate can be easily divisionally cut, and yield of the semiconductor chip can be improved.

Alternatively, the pressing element locally may press a predetermined position of the sheet in a predetermined order. In this case, since the pressing member presses a portion in a predetermined position of the rear face of the sheet in a sequential order, the semiconductor substrate can be preferentially divisionally cut from the semiconductor chip not easily divisionally cut. Accordingly, the semiconductor substrate can be easily divisionally cut, and yield of the semiconductor chip can be improved.

Alternatively, the predetermined order may be an order from a periphery to a center of the sheet. Here, when the semiconductor chip not easily divisionally cut exists near the outer circumference of the semiconductor substrate, a problem exists in that the sheet is excessively extended to divisionally cut this semiconductor chip and no force is applied to the central portion of the semiconductor substrate. In such a case, in the above device, the pressing member also sequentially presses a portion in a predetermined position of the rear face of the sheet from an outer circumferential direction of the semiconductor substrate to a central direction. Therefore, the pressing member reliably divisionally cuts the semiconductor substrate from the semiconductor chip of the outer circumferential direction of the semiconductor substrate. Accordingly, there is no case in which the sheet is excessively extended and no force is applied to the central portion of the semiconductor substrate. Accordingly, the semiconductor substrate can be easily divisionally cut, and yield of the semiconductor chip can be improved.

Alternatively, the predetermined order may be an order from a center to a periphery of the sheet. In this case, the pressing member sequentially presses a portion in a predetermined position of the rear face of the sheet from the central direction of the semiconductor substrate to the outer circumferential direction. Therefore, the semiconductor substrate can be preferentially divisionally cut from the semiconductor chip near the central portion of the semiconductor substrate not easily divisionally cut. Accordingly, the semiconductor substrate can be easily divisionally cut, and yield of the semiconductor chip can be improved.

Alternatively, the device may further include a reforming region forming element for forming a reforming region in the semiconductor substrate. The reforming region forming element includes a laser head for irradiating a laser beam on the semiconductor substrate along with the cutting line so that the reforming region is formed at a focus point in the semiconductor substrate by a multi-photon absorbing effect, and the semiconductor substrate having the reforming region is separated from the reforming region as a starting point of separation. In this case, a reforming area forming means is arranged. While a laser head for irradiating a laser beam is relatively moved with respect to the above semiconductor substrate along the divisional cutting schedule line, the reforming area forming means irradiates the laser beam by conforming a convergent point to the interior of the semiconductor substrate, and forms a reforming area using multiphoton absorption at the convergent point. The above device is suitably used in a structure having a construction for divisionally cutting the semiconductor substrate formed via this reforming area forming process with the reforming area as a starting point. Namely, the substrate face of the rear face of the semiconductor substrate is adhered to the sheet and can be then diced. Therefore, a dicing process can be shortened, and no dust is generated at a dicing time. Therefore, there is no fear that dust is attached to the substrate face of the semiconductor substrate.

Alternatively, the device may further include a vibrating element for vibrating the semiconductor substrate. In this case, the divisional cutting device of the semiconductor substrate has a vibrating means for giving a vibration to the semiconductor substrate. Therefore, a crack can be developed on the divisional cutting schedule line by a physical action of the vibration, and force required in the divisional cutting can be reduced. Accordingly, the semiconductor substrate can be easily divisionally cut, and yield of the semiconductor chip can be improved.

Alternatively, the device may further include a heating element for heating the semiconductor substrate. In this case, the divisional cutting device of the semiconductor substrate has a heating means for heating the semiconductor substrate. Therefore, thermal stress can be loaded on the divisional cutting schedule line, and force required in the divisional cutting can be reduced. Accordingly, the semiconductor substrate can be easily divisionally cut, and yield of the semiconductor chip can be improved. Specifically, when the reforming area is formed along the divisional cutting schedule line, the difference in thermal expansion between the reforming area and an unreformed area is large. Therefore, since large thermal stress is generated, the semiconductor substrate can be easily divisionally cut, and yield of the semiconductor chip can be improved.

According to a sixth aspect of the present disclosure, a method for separating a semiconductor substrate into a plurality of chips along with a cutting line on the semiconductor substrate is provided. The method includes: bonding the semiconductor substrate to a sheet; holding a periphery of the sheet with a frame; and locally pressing the sheet from a side of the sheet opposite to the semiconductor substrate so that the sheet is expanded and the semiconductor substrate is separated into the chips.

In the above method, a place for pressing the rear face of the sheet can be selected in the divisional cutting process. Therefore, it is possible to locally press a portion in a position for generating stress on the divisional cutting schedule line not easily divisionally cut. Accordingly, the semiconductor substrate can be easily divisionally cut by loading sufficient stress on the divisional cutting schedule line not easily divisionally cut. Further, since the contact area of the sheet and the pressing member becomes small, no extension of the sheet is restricted by frictional force with respect to the pressing member, and the sheet can be uniformly extended. Accordingly, the semiconductor substrate can be easily divisionally cut, and yield of the semiconductor chip can be improved. Accordingly, it is possible to realize the divisional cutting method of the semiconductor substrate able to improve yield of the semiconductor chip obtained by divisionally cutting the semiconductor substrate.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for separating a semiconductor substrate into a plurality of chips along with a cutting line on the semiconductor substrate, the method comprising:

irradiating a laser beam on the semiconductor substrate along with the cutting line so that a reforming region is formed at a focus point in the semiconductor substrate by a multi-photon absorbing effect;

bonding the semiconductor substrate to a sheet;

holding a periphery of the sheet with a frame; and locally pressing the sheet from a side of the sheet opposite to the semiconductor substrate so that the sheet is expanded and the semiconductor substrate is separated into the chips along with the reforming region, wherein locally pressing the sheet is performed from an outer periphery to a center of the substrate, locally pressing the sheet is performed by a plurality of pressing pins, and locally pressing the sheet further comprises:

lifting up a first one of the pressing pins, which is located on an outermost circumferential side of the substrate so that an outer part of the sheet is expanded;

lifting down the first one of the pressing pins;

lifting up a second one of the pressing pins, which is located in the middle of the substrate so that a middle part of the sheet is expanded;

lifting down the second one of the pressing pins;

lifting up a third one of the pressing pins, which is located at the center of the substrate so that a center part of the sheet is expanded; and lifting down the third one of the pressing pins.

* * * * *